(12) United States Patent
Okumoto et al.

(10) Patent No.: US 8,871,579 B2
(45) Date of Patent: Oct. 28, 2014

(54) SEMICONDUCTOR TRANSISTOR MANUFACTURING METHOD, DRIVING CIRCUIT UTILIZING A SEMICONDUCTOR TRANSISTOR MANUFACTURED ACCORDING TO THE SEMICONDUCTOR TRANSISTOR MANUFACTURING METHOD, PIXEL CIRCUIT INCLUDING THE DRIVING CIRCUIT AND A DISPLAY ELEMENT, DISPLAY PANEL HAVING THE PIXEL CIRCUITS DISPOSED IN A MATRIX, DISPLAY APPARATUS PROVIDED WITH THE DISPLAY PANEL

(75) Inventors: Yuko Okumoto, Osaka (JP); Akihito Miyamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 294 days.

(21) Appl. No.: 13/291,424

(22) Filed: Nov. 8, 2011

(65) Prior Publication Data

US 2012/0161138 A1 Jun. 28, 2012

Related U.S. Application Data

(63) Continuation of application No. PCT/JP2010/007525, filed on Dec. 24, 2010.

(51) Int. Cl.
| | | |
|---|---|---|
| *H01L 21/00* | (2006.01) | |
| *H01L 21/84* | (2006.01) | |
| *H01L 51/10* | (2006.01) | |
| *H01L 29/66* | (2006.01) | |
| *H01L 51/05* | (2006.01) | |
| *H01L 29/786* | (2006.01) | |

(52) U.S. Cl.
CPC ........ *H01L 29/66742* (2013.01); *H01L 51/102* (2013.01); *H01L 51/0541* (2013.01); *H01L 29/7869* (2013.01)
USPC .................................. 438/159; 257/E21.414

(58) Field of Classification Search
CPC ............ H01L 51/0541; H01L 29/7869; H01L 29/66742

USPC .................................. 438/159; 257/E21.414
See application file for complete search history.

(56) References Cited

U.S. PATENT DOCUMENTS

| | | | |
|---|---|---|---|
| 3,024,179 A | * | 3/1962 | Sanders ........................ 438/570 |
| 5,443,922 A | | 8/1995 | Nishizaki et al. |

(Continued)

FOREIGN PATENT DOCUMENTS

| | | |
|---|---|---|
| JP | 05-163488 | 6/1993 |
| JP | 2007-005698 | 1/2007 |
| JP | 2010-161312 | 7/2010 |

OTHER PUBLICATIONS

"First Film-Based Organic Device Symposium Conference Report", , , PP. Partial English Translation, Oct. 21, 2011.

*Primary Examiner* — Jarrett Stark

(74) *Attorney, Agent, or Firm* — Greenblum & Bernstein, P.L.C.

(57) ABSTRACT

Provided is a manufacturing method for a semiconductor transistor comprising: forming a resist layer containing resist material on a base layer including a substrate; patterning the resist layer to form apertures therein; forming a metal layer by disposing metallic material to cover the resist layer and to fill the apertures formed in the resist layer; removing a metal oxide layer formed by oxidation of a top surface of the metal layer by performing cleaning by using a cleaning liquid; forming the source electrode and the drain electrode by removing the resist layer by using a dissolution liquid different from the cleaning liquid, the source electrode and the drain electrode constituted of the metallic material having been disposed in the apertures; and forming a semiconductor layer so as to cover the source electrode and the drain electrode.

16 Claims, 20 Drawing Sheets

(56) References Cited

U.S. PATENT DOCUMENTS

| | | | |
|---|---|---|---|
| 5,654,030 A * | 8/1997 | Munshi et al. | 427/2.24 |
| 5,726,097 A * | 3/1998 | Yanagida | 438/622 |
| 6,022,425 A * | 2/2000 | Nelson et al. | 148/272 |
| 6,076,264 A * | 6/2000 | Meckel | 30/225 |
| 6,217,704 B1 * | 4/2001 | Kitagawa | 156/345.33 |
| 6,309,959 B1 * | 10/2001 | Wang et al. | 438/625 |
| 6,664,196 B1 * | 12/2003 | Wada et al. | 438/754 |
| 7,176,140 B1 * | 2/2007 | Rivkin et al. | 438/706 |
| 7,402,506 B2 * | 7/2008 | Levy et al. | 438/584 |
| 2003/0082912 A1 * | 5/2003 | Kezuka et al. | 438/689 |
| 2006/0000492 A1 * | 1/2006 | Carter | 134/26 |
| 2006/0289859 A1 | 12/2006 | Yoneya | |
| 2008/0160750 A1 * | 7/2008 | Takewaki et al. | 438/598 |
| 2009/0035935 A1 * | 2/2009 | Kim et al. | 438/643 |
| 2009/0092162 A1 * | 4/2009 | Huff et al. | 372/36 |
| 2009/0158750 A1 * | 6/2009 | Rubin | 62/3.2 |
| 2010/0176387 A1 | 7/2010 | Kuzumoto et al. | |
| 2013/0058009 A1 * | 3/2013 | Kim et al. | 361/502 |
| 2013/0058010 A1 * | 3/2013 | Kim et al. | 361/523 |

\* cited by examiner

| Stress application period t [s] | Threshold voltage Vth [V] | Threshold voltage shift ΔVth [V] |
|---|---|---|
| 0 | −2.32 | |
| 100 | −2.86 | 0.54 |
| 200 | −2.88 | 0.56 |
| 1000 | −2.85 | 0.53 |
| 2000 | −3.04 | 0.72 |
| 10000 | −3.03 | 0.71 |

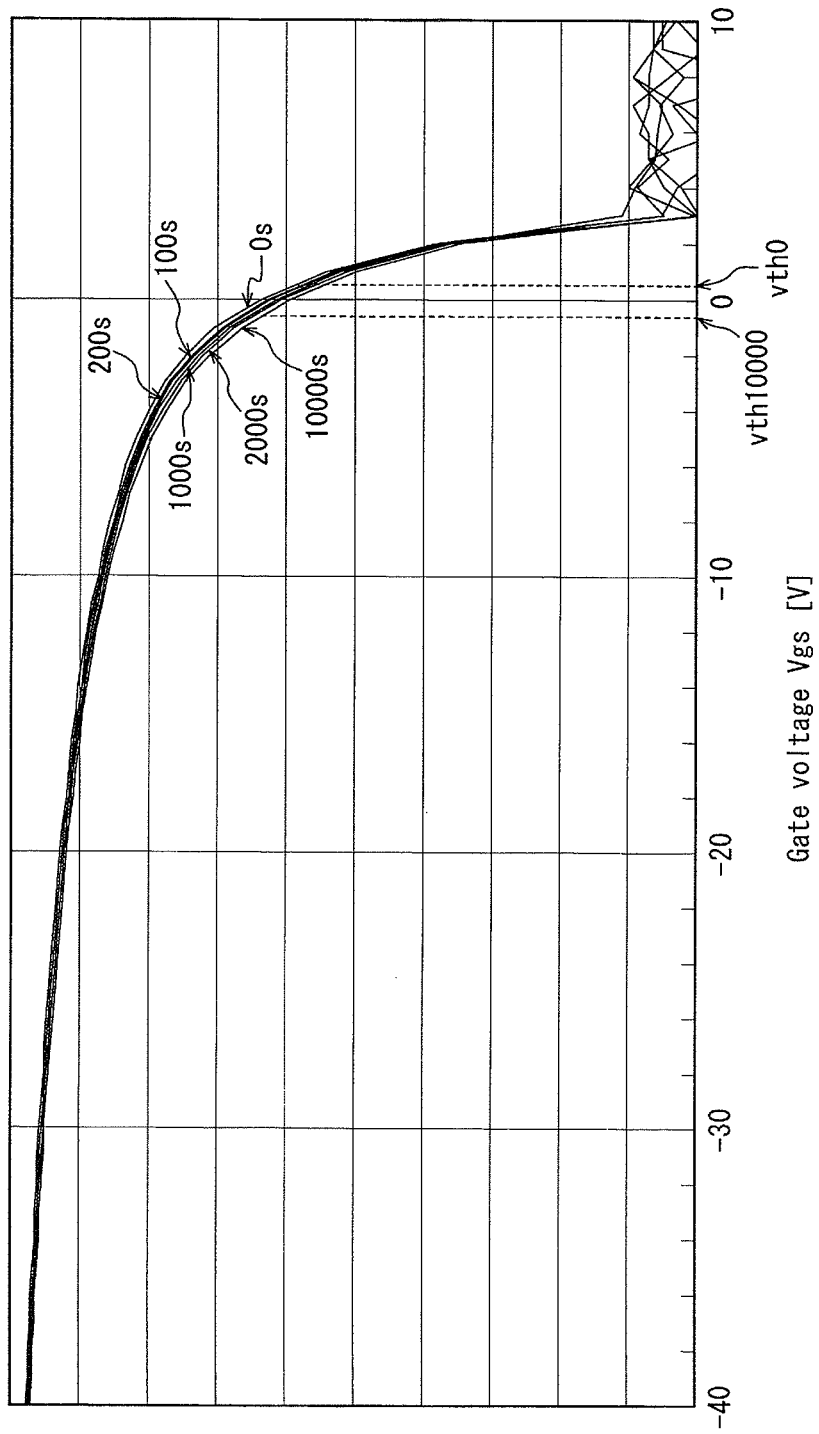

| Stress application period t [s] | Threshold voltage Vth [V] | Threshold voltage shift ΔVth [V] |
|---|---|---|
| 0 | 1.29 | |
| 100 | 0.00 | 1.29 |
| 200 | −0.24 | 1.53 |
| 1000 | −1.08 | 2.37 |
| 2000 | −1.83 | 3.12 |
| 10000 | −4.48 | 5.76 |

| Stress application period t [s] | Threshold voltage Vth [V] | Threshold voltage shift ΔVth [V] |
|---|---|---|
| 0 | 0.33 | |
| 100 | 0.09 | 0.24 |
| 200 | 0.03 | 0.30 |
| 1000 | −0.12 | 0.45 |
| 2000 | −0.28 | 0.61 |
| 10000 | −0.52 | 0.85 |

| Stress application period t [s] | Threshold voltage Vth [V] | Threshold voltage shift ΔVth [V] |
|---|---|---|
| 0 | 1.25 | |
| 100 | −0.86 | 2.11 |
| 200 | −1.59 | 2.84 |
| 1000 | −3.52 | 4.77 |
| 2000 | −4.43 | 5.68 |
| 10000 | −6.76 | 8.01 |

| Stress application period t [s] | Threshold voltage Vth [V] | Threshold voltage shift ΔVth [V] |
|---|---|---|
| 0 | 0.36 | |
| 100 | 0.15 | 0.22 |
| 200 | 0.11 | 0.25 |
| 1000 | 0.03 | 0.34 |
| 2000 | −0.07 | 0.43 |
| 10000 | −0.31 | 0.68 |

SEMICONDUCTOR TRANSISTOR MANUFACTURING METHOD, DRIVING CIRCUIT UTILIZING A SEMICONDUCTOR TRANSISTOR MANUFACTURED ACCORDING TO THE SEMICONDUCTOR TRANSISTOR MANUFACTURING METHOD, PIXEL CIRCUIT INCLUDING THE DRIVING CIRCUIT AND A DISPLAY ELEMENT, DISPLAY PANEL HAVING THE PIXEL CIRCUITS DISPOSED IN A MATRIX, DISPLAY APPARATUS PROVIDED WITH THE DISPLAY PANEL

This is a continuation of International Application PCT/JP2010/007525, with an international filing date of Dec. 24, 2010.

TECHNICAL FIELD

The present invention relates to a semiconductor transistor manufacturing method, a driving circuit utilizing a semiconductor transistor manufactured according to the semiconductor transistor manufacturing method, a pixel circuit including the driving circuit and a display element, a display panel having the pixel circuits disposed in a matrix, and a display apparatus provided with the display panel.

DESCRIPTION OF THE RELATED ART

One conventional type of semiconductor transistor is a thin-film transistor (also referred to hereinafter as "TFT"). A TFT is a type of a field effect transistor, and is used, for instance, in driving circuits for EL display panels, whose research and development is making much progress in recent years.

A common thin-film transistor includes: a glass substrate; a gate electrode formed on the glass substrate; and a gate insulating layer disposed on the glass substrate so as to cover the gate electrode. The common thin-film transistor further includes: a source electrode and a drain electrode (also collectively referred to hereinafter as "SD electrodes") formed on the gate insulating layer with a predetermined distance between each other; and a semiconductor layer formed on the gate insulating layer so as to cover the SD electrodes (refer to Patent Literature 1, for instance). For forming the SD electrodes, materials such as gold (Au), silver (Ag), copper (Cu), aluminum (Al), molybdenum (Mo), and tungsten (W) are used.

Concerning the forming of the SD electrodes in a TFT, there are cases where a lift-off process is used. In a lift-off process, firstly, a resist layer is formed on the gate insulating layer. Subsequently, apertures are formed in areas of the resist layer where the SD electrodes are to be formed. Following the forming of the apertures, a metal layer is formed by disposing electrode material so as to cover the resist layer and to fill the apertures formed in the resist layer. Finally, the resist layer is removed to form the SD electrodes. In the removal of the resist layer, the metal layer formed on the resist layer is removed along with the resist layer. Hence, only areas of the metal layer corresponding to the apertures in the resist layer remain as the SD electrodes.

In the forming of the metal layer on the resist layer, methods such as the vapor deposition method and the sputtering method are used. Taking this into account, the lift-off process is advantageous in that, since the resist layer is formed on areas of the gate insulating layer where the semiconductor layer is to be formed, the forming of the metal layer can be performed while preventing damage from being caused to such areas of the gate insulating layer by sputtering.

CITATION LIST

Patent Literature

[Patent Literature 1] Japanese Patent Application Publication No. 2007-5698

SUMMARY OF INVENTION

Technical Problem

As already mentioned above, by applying the lift-off process in the manufacturing of a semiconductor transistor, the metal layer can be formed while not causing damage to areas of the gate insulating layer on which the semiconductor layer is to be formed.

However, there still remains room for improvement in the manufacturing of semiconductor transistors applying the lift-off process, especially concerning the problem of threshold voltage shift.

Hence, an objective of the present invention is to provide a manufacturing method for a semiconductor transistor with a reduced amount of threshold voltage shift occurring during application of electricity.

Solution to the Problems

In view of the above-presented problems, one aspect of the present invention is a manufacturing method for a semiconductor transistor that includes: a gate electrode; a gate insulating layer; a source electrode; a drain electrode; and a semiconductor layer, the manufacturing method comprising: a first step of forming a resist layer containing resist material on a base layer that includes a substrate; a second step of patterning areas of the resist layer and thereby forming a plurality of apertures; a third step of forming a metal layer containing metallic material so as to cover the resist layer and to fill the apertures formed in the resist layer, the metallic material being for forming a source electrode and a drain electrode; a fourth step of removing a metal oxide layer by performing cleaning with use of a liquid for cleaning, the metal oxide layer being formed by oxidation of a top surface of the metal layer; a fifth step, subsequent to the fourth step, of forming the source electrode and the drain electrode by removing the resist layer by use of a liquid for dissolution different from the liquid for cleaning, the source electrode and the drain electrode constituted of the metallic material having been disposed in the apertures; and a sixth step of forming a semiconductor layer so as to cover the source electrode and the drain electrode.

Advantageous Effects of the Invention

According to the semiconductor transistor manufacturing method which is one aspect of the present invention, a fourth step of removing the metal oxide layer is incorporated as a process preceding the fifth step of removing the resist layer and thus forming the source electrode and the drain electrode. In specific, the metal oxide layer, which is formed by the oxidation of the surface portion of the metal layer, is removed by using the liquid for cleaning that is different from the liquid for dissolution used in the subsequent fifth step.

Hence, since the metal oxide layer is removed prior to the fifth step of removing the resist layer with use of the liquid for dissolution, the amount of metal oxide particles dissolving into the liquid for dissolution during the removal of the resist layer is reduced. As a result, the amount of metal oxide residue is reduced, and further, the amount of resist residue adhering onto the channel region after the completion of the fifth step is reduced.

Hence, since the amount of resist residue adhering onto the channel region after the completion of the fifth step is reduced, the amount of threshold voltage shift of the semiconductor transistor is reduced.

BRIEF DESCRIPTION OF THE DRAWINGS

FIG. 13 illustrates drain current (Id)-gate voltage (Vgs) characteristics when the pre-cleaning is performed.

DESCRIPTION OF EMBODIMENT

Description of how the Inventors Arrived at an Embodiment of the Present Invention Prior to providing specific description on an embodiment of the present invention, the following provides explanation on how the inventors of the present invention arrived at the embodiment of the present invention.

Figure 1:
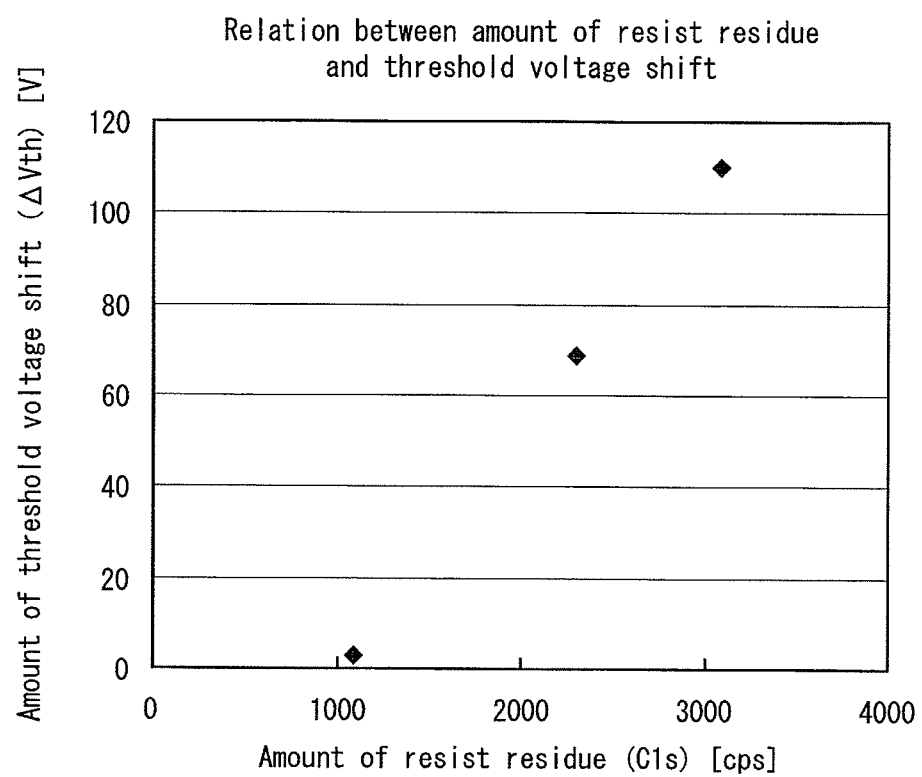
FIG. 1 illustrates a relation between an amount of resist residue (C1s) and an amount ($\Delta$Vth) of threshold voltage (Vth) shift.

The inventors of the present invention conducted an experiment with respect to a semiconductor transistor, in order to observe and analyze the relation between (i) an amount of resist residue that exists when a source electrode and a drain electrode are formed and (ii) an amount of threshold voltage shift that occurs during the application of electricity. Firstly in the experiment, the inventors formed SD electrodes on a gate insulating layer by applying the lift-off process. Porphyrin was used as the organic semiconductor material, and further, gold (Au) having an excellent electric charge injection characteristic with respect to porphyrin was used as the electrode material for forming the SD electrodes. Subsequently, the inventors conducted an XPS (X-ray photoelectron spectroscopy) measurement to measure an amount of resist residue in an area on the gate insulating layer between the source electrode and the drain electrode. The amount of resist residue was obtained by measuring a cps (counts per second) amount of the C1s. Following the XPS measurement, the inventors formed an organic semiconductor layer on the gate insulating layer so as to cover the SD electrodes, and applied stress voltage (also referred to hereinafter simply as "stress") (where gate voltage (Vgs)=−40 V, and drain-source voltage (Vds)=−40 V) with respect to the semiconductor transistor so yielded for a period of 20000 s so as to measure the amount of threshold voltage shift that occurs. The same experiment as above was actually conducted two more times, and the amount of time spent on cleaning and thus removing resist residue was changed each time. FIG. 1 illustrates the results of such experiments. FIG. 1 illustrates a relation between the amount of resist residue (C1s) and the amount ($\Delta$Vth) of threshold voltage (Vth) shift. In FIG. 1, the horizontal axis indicates the cps amount of C1s, and the vertical axis indicates the amount ($\Delta$Vth) of threshold voltage (Vth) shift. As is illustrated in FIG. 1, it was observed by the inventors that the amount of threshold voltage shift increases when a greater amount of resist residue exists.

Figure 2:
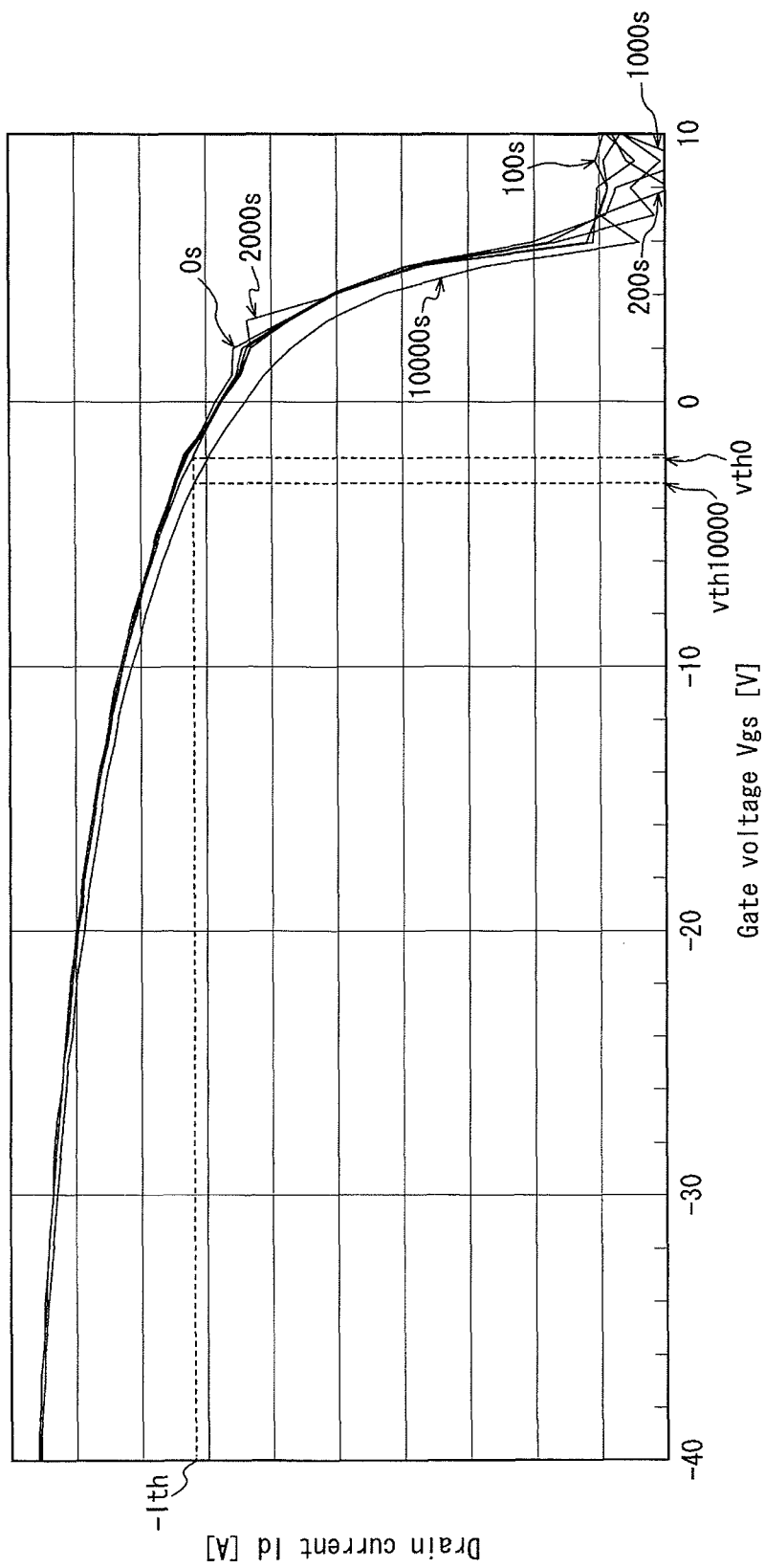
FIG. 2 illustrates drain current (Id)-gate voltage (Vgs) characteristics when the amount of resist residue (C1s) is restricted to be equal to or below 1000 cps.

FIG. 2 illustrates drain current (Id)-gate voltage (Vgs) characteristics of a semiconductor transistor when gold (Au) is used as the electrode material for forming the SD electrodes and further, when the amount of resist residue (C1s) is restricted to be equal to or below 1000 cps. In FIG. 2, the horizontal axis indicates gate voltage (Vgs) and the vertical axis indicates drain current (Id). Further, the drain current (Id)-gate voltage (Vgs) characteristics of the semiconductor transistor after different stress application periods (0 s, 100 s, 200 s, 1000 s, 2000 s, and 10000 s) are illustrated. Note that a stress application period indicates a period of time during which stress is continuously applied to the semiconductor transistor. Here, a constant stress voltage was applied to the semiconductor transistor, where gate voltage (Vgs)=−40 V and drain-source voltage (Vds)=−40 V. As is illustrated in FIG. 2, it was observed by the inventors that, although a shift towards the negative direction was seen in the threshold voltage as the stress application period extended, the overall amount of threshold voltage shift was small. Note that, here, a threshold voltage is defined as a negative gate voltage at which a predetermined current −Ith begins to flow when gate voltage is changed from an original value of 0 V to the threshold voltage. As for the specific method for calculating the threshold voltage of a semiconductor transistor, a threshold voltage Vth is defined as an intersection point of a tangential line and a horizontal axis in a graph where the vertical axis indicates √Id and the horizontal axis indicates Vg. The tangential line here is a line extending from a point of the graph exhibiting the greatest √Id inclination. In FIG. 2, indication is provided of examples of the threshold voltage when the stress application period was 0s and 10000s (Vth0 and Vth10000). The amount of threshold voltage shift occurring between the stress application periods of 0 s to 10000 s was approximately 1 V.

Figures 3A, 3B:
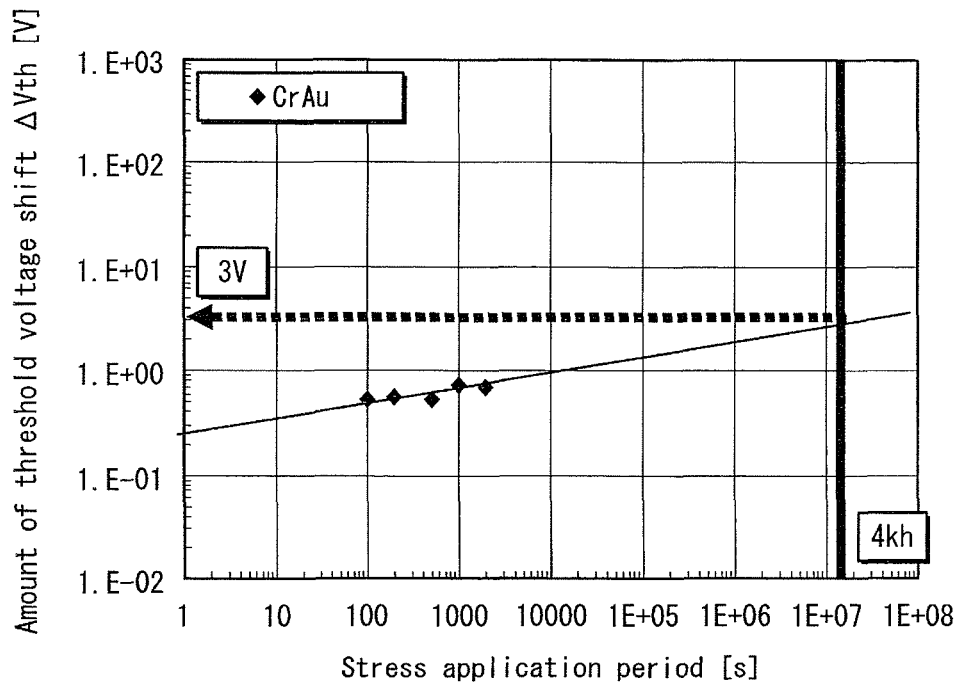
FIG. 3A illustrates relations between stress application period (t), threshold voltage (Vth), and the amount of threshold voltage shift ($\Delta$Vth).
FIG. 3B illustrates relations between stress application period (t) and the amount of threshold voltage shift ($\Delta$Vth).

Detailed description is provided hereinafter of the amount of threshold voltage shift with reference to the accompanying FIGS. 3A and 3B. FIG. 3A illustrates relations between stress application period, threshold voltage, and the amount of threshold voltage shift. More specifically, FIG. 3A illustrates threshold voltages at different points during the application of stress (0 s, 100 s, 200 s, 1000 s, 2000 s, and 10000 s) and a corresponding amount of threshold voltage shift measured after each of the different points by comparison with the threshold voltage when the stress application period is 0 s. FIG. 3B illustrates relations between stress application periods and the corresponding amounts of threshold voltage shift after each of the different stress application periods, and is a table of logarithms indicative of the stress application periods and the corresponding amounts of threshold voltage shift illustrated in FIG. 3A. In FIG. 3B, the horizontal axis indicates stress application periods and the vertical axis indicates corresponding amounts of threshold voltage shift. As is illustrated in FIG. 3B, the amount of threshold voltage shift indicates an increase as the stress application period extends. For instance, when the stress application period reaches 4000 hours (indicated hereinafter as "4 kh"), the threshold voltage shift level reaches 3 V.

As description is provided in the above, it was observed by the inventors through such experimentation that, when the amount of resist residue is restricted to equal to or below 1000 cps, the amount of threshold voltage shift taking place after the application of electricity until a stress application period of 4 kh is reduced to 3 V. In contrast to this, it is known that in semiconductor transistors manufactured by using amorphous silicon (referred to hereinafter as "a-Si"), the amount of threshold voltage shift after a stress application period of 4 kh reaches approximately 45 V. Hence, it could be concluded that the inventors succeeded in yielding a semiconductor transistor having a higher level of stability compared with a conventional a-Si semiconductor transistor through the above experiment.

However, one drawback of the semiconductor transistor yielded through the above experiment is that gold (Au) is expensive when compared with other materials, and therefore, the yielded semiconductor transistor is not completely suitable for mass production. In view of this, the inventors of the present invention conducted the above-described experiment once more, this time using molybdenum (Mo), which is less expensive compared with gold and therefore more suitable for mass production of semiconductor transistors, as the electrode material. In this experiment where molybdenum was used as the electrode material of the semiconductor transistor, a significant increase in the amount of resist residue was observed, when compared with the previous experiment where gold (Au) was used as the electrode material. Here, it should be noted that, in view of such a result, those having ordinary skill in the related field would immediately assume that the residue produced as a result of the lift-off process is resist residue, especially since a resist layer is formed at an interface (a channel region) between the gate insulating layer and the semiconductor layer when the lift-off process is applied.

However, as a result of careful and close observation of the substrate for the cause of the increase in the amount of resist residue, the inventors found metal (molybdenum) oxide residue present on the gate insulating layer, the existence of which was not observed when gold (Au) was used as the electrode material.

Figure 4:
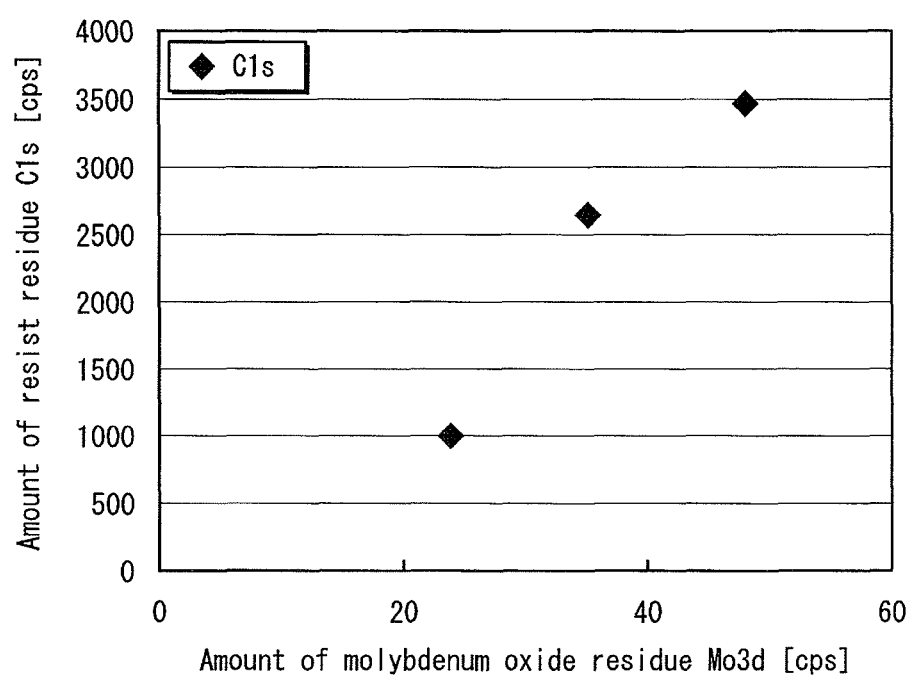
FIG. 4 illustrates a relation between an amount of molybdenum oxide residue (Mo3d) and the amount of resist residue (C1s).

As such, the inventors focused on the relation between the amount of molybdenum oxide residue and the amount of resist residue, and conducted a new experiment so as to clarify such a relation. FIG. 4 illustrates the results of the experiment. More specifically, FIG. 4 illustrates the relation between an amount of molybdenum oxide residue (Mo3d) and the amount of resist residue (C1s). In FIG. 4, the horizontal axis indicates a cps amount of Mo3d, which derives from molybdenum oxide, whereas the vertical axis indicates a cps amount of C1s, which derives from resist material. As is illustrated in FIG. 4, the inventors reached a conclusion that there is a correlation (a proportional relation) between the amount of molybdenum oxide residue and the amount of resist residue, and that the increase of the amount of resist residue is caused by the existence of the molybdenum residue.

As already stated in the above, it could be reasonably assumed that one having ordinary skill in the related art would commonly consider that residue present at the interface between the gate insulating layer and the semiconductor layer is resist residue, since the interface has been once covered with the resist layer.

However, the inventors of the present invention have reached a new finding that the increase of resist residue is actually caused by the presence of metal oxide residue. Further, and as a result of such a finding, the inventors of the present invention have arrived at conducting, as pre-processing preceding the forming of the SD electrodes by removing the resist layer with use of a dissolution liquid, a cleaning process using a cleaning solution that dissolves metal oxides. The incorporation, by the inventors, of the cleaning process which involves dissolving and thus removing metal oxides, as pre-processing before the removal of the resist layer, was made possible by having arrived at the above-mentioned finding. Thus, it can be assumed that, considering the conventional technical perspective shared by those having ordinary skill in the related field, the above-mentioned technology of incorporating the dissolving of the metal oxides as pre-processing in the manufacturing of semiconductor transistors is a technology that cannot be easily achieved.

By incorporating the pre-processing where removal of metal oxides is performed, the amount of resist residue adhering onto the channel region is reduced, which further brings about a reduction in the amount of threshold voltage shift taking place.

In conclusion, the inventors of the present invention have arrived at the manufacturing method for a semiconductor transistor that is one aspect of the present invention as a result of the new finding having been made through accumulation of careful experimentation and observation.

Aspects of the Invention

One aspect of the present invention is a manufacturing method for a semiconductor transistor that includes: a gate electrode; a gate insulating layer; a source electrode; a drain electrode; and a semiconductor layer, the manufacturing method comprising: a first step of forming a resist layer containing resist material on a base layer that includes a substrate; a second step of patterning areas of the resist layer and thereby forming a plurality of apertures; a third step of forming a metal layer containing metallic material so as to cover the resist layer and to fill the apertures formed in the resist layer, the metallic material being for forming a source electrode and a drain electrode; a fourth step of removing a metal oxide layer by performing cleaning with use of a liquid for cleaning, the metal oxide layer being formed by oxidation of a top surface of the metal layer; a fifth step, subsequent to the fourth step, of forming the source electrode and the drain electrode by removing the resist layer by use of a liquid for dissolution different from the liquid for cleaning, the source electrode and the drain electrode constituted of the metallic material having been disposed in the apertures; and a sixth step of forming a semiconductor layer so as to cover the source electrode and the drain electrode.

According to the semiconductor transistor manufacturing method which is one aspect of the present invention, a fourth step of removing the metal oxide layer is incorporated as a process preceding the fifth step of removing the resist layer and thus forming the source electrode and the drain electrode. In specific, the metal oxide layer, which is formed by the oxidation of the surface portion of the metal layer, is removed by using the liquid for cleaning that is different from the liquid for dissolution used in the subsequent fifth step.

Hence, since the metal oxide layer is removed prior to the fifth step of removing the resist layer with use of the liquid for dissolution, the amount of metal oxide particles dissolving into the liquid for dissolution is reduced. As a result, the amount of metal oxide residue is reduced, and further, the amount of resist residue adhering onto the channel region after the fifth step is reduced.

Hence, since the amount of resist residue adhering onto the channel region after the completion of the fifth step is reduced, the amount of threshold voltage shift of the semiconductor transistor is reduced.

In addition, in the fourth step, the removal of the metal oxide layer by using the liquid for cleaning may be performed without removing the resist layer.

Further in addition, in the manufacturing method, an alkaline solution may be used as the liquid for cleaning in the fourth step, and an organic stripper solution may be used as the liquid for dissolution in the fifth step.

Also, in the manufacturing method, the metallic material for forming the metal layer in the third step may be one of tungsten, molybdenum, and a molybdenum-tungsten alloy.

The use of one of tungsten, molybdenum, and a molybdenum-tungsten alloy as the metallic material for forming the source electrode and the drain electrode is effective in that mass production of semiconductor transistors is facilitated.

Also, in the manufacturing method, the base layer may further include, in addition to the substrate: a gate electrode formed on the substrate; and a gate insulating layer formed so as to cover the gate electrode.

Another aspect of the present invention is a driving circuit incorporating a semiconductor transistor manufactured according to the manufacturing method pertaining to one aspect of the present invention.

The driving circuit is obtained by using a semiconductor transistor which is manufactured according to the manufacturing method pertaining to one aspect of the present invention, and thus, has a reduced amount of resist residue adhering onto the channel region. As such, the amount of threshold voltage shift of the semiconductor transistor of the driving circuit is reduced.

Another aspect of the present invention is a pixel circuit comprising: a display element; and a driving circuit that supplies driving current to the display element, wherein the driving circuit incorporates a semiconductor transistor manufactured according to the manufacturing method pertaining to one aspect of the present invention.

The driving circuit of the pixel circuit is obtained by using a semiconductor transistor which is manufactured according to the manufacturing method pertaining to one aspect of the present invention, and thus, has a reduced amount of resist residue adhering onto the channel region. As such, the amount of threshold voltage shift of the semiconductor transistor of the driving circuit included in the pixel circuit is reduced.

Another aspect of the present invention is a display panel comprising: a plurality of pixel circuits disposed in a matrix state, each of the pixel circuits including: a display element; and a driving circuit that supplies driving current to the display element, wherein the driving circuit incorporates a semiconductor transistor manufactured according to the manufacturing method pertaining to one aspect of the present invention.

Each of the driving circuits of the display panel is obtained by using a semiconductor transistor which is manufactured according to the manufacturing method pertaining to one aspect of the present invention, and thus, has a reduced amount of resist residue adhering onto the channel region. As such, the amount of threshold voltage shift of the semiconductor transistor of each of the driving circuits included in the display panel is reduced.

Another aspect of the present invention is a display apparatus comprising the display panel pertaining to one aspect of the present invention.

Each of the driving circuits of the display apparatus is obtained by using a semiconductor transistor which is manufactured according to the manufacturing method pertaining to one aspect of the present invention, and thus, has a reduced amount of resist residue adhering onto the channel region. As such, the amount of threshold voltage shift of the semiconductor transistor of each of the driving circuits included in the display apparatus is reduced.

Embodiment 1

<Structure of Display Apparatus 100>

Figure 5A:
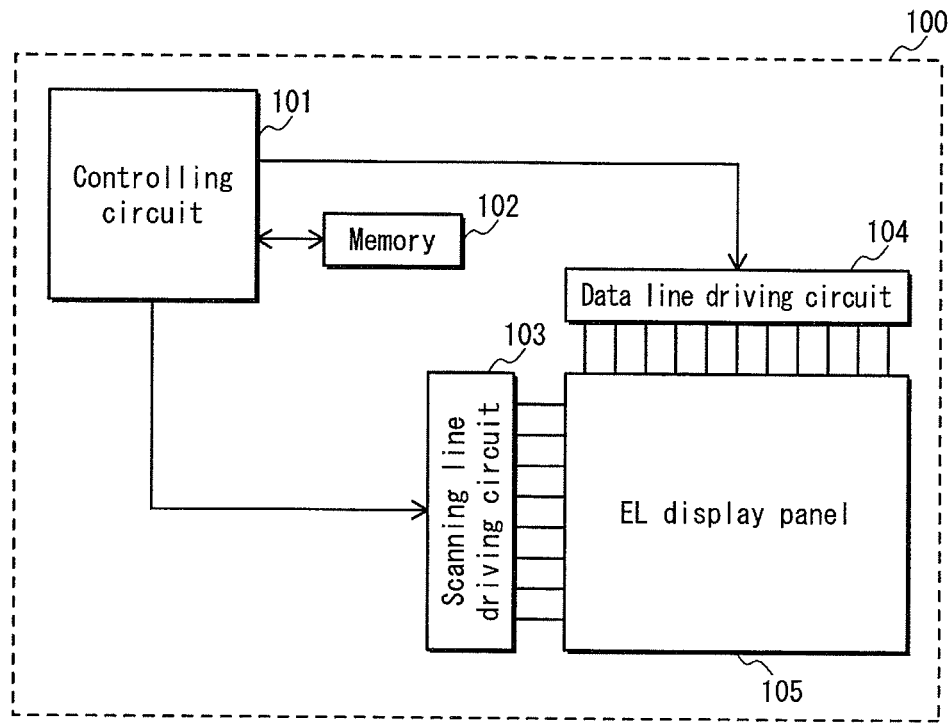
FIG. 5A is a block diagram illustrating an electrical structure of a display apparatus 100 pertaining to embodiment 1 of the present invention.
Figure 5B:
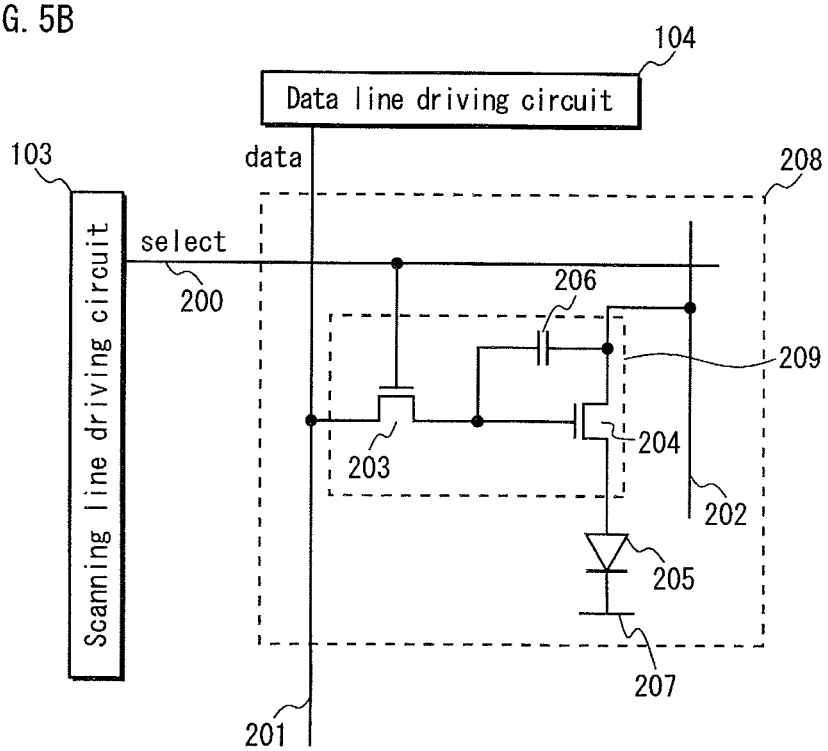
FIG. 5B illustrates a circuit structure of a pixel circuit of an EL display panel 105 and how the pixel circuit is connected with peripheral circuits.

Description is provided in the following concerning the overall structure of a display apparatus 100 pertaining to the present embodiment, with reference to the accompanying FIG. 5A. FIG. 5A is a block diagram illustrating an electrical structure of the display apparatus 100 pertaining to embodiment 1 of the present invention. The display apparatus 100 illustrated in FIG. 5A includes: a controlling circuit 101; a memory 102; a scanning line driving circuit 103; a data line driving circuit 104; and an EL display panel 105 including pixel circuits disposed to form a matrix. Further, FIG. 5B illustrates a circuit structure of one pixel circuit of the EL display panel 105 and a connection of the pixel circuit with peripheral circuits. A pixel circuit 208 illustrated in FIG. 5B includes: a scanning line 200; a data line 201; a power supply line 202; a switching transistor 203; a driving transistor 204; an EL element 205; a retention capacitor 206; and a common electrode 207. Here, the switching transistor 203 and the driving transistor 204 are organic thin-film transistors (OTFT), and are manufactured according to the manufacturing method which is one aspect of the present invention. Detailed explanation concerning the structures and manufacturing methods of the transistors is to be provided in the following.

The scanning line driving circuit 103 and the data line driving circuit 104 together compose the peripheral circuit. Additionally, the switching transistor 203, the driving transistor 204, and the retention capacitor 206 compose a driving circuit 209.

A signal voltage supplied from the data line driving circuit 104 is applied to a gate electrode of the driving transistor 204 via the switching transistor 203. The driving transistor 204 causes an electric current to flow between a source electrode and a drain electrode therein. The electric current that flows between the SD electrodes is in accordance with the voltage applied thereto. The electric current then flows to the EL element 205, thereby causing the EL element 205 to emit light at a corresponding luminous intensity.

In the following, explanation is provided of an organic thin-film transistor, taking the driving transistor 204 as an example. Note that the switching transistor 203 has a structure similar to the driving transistor 204, and therefore, explanation thereof is omitted.

<Structure of Driving Transistor 204>

Figure 6:
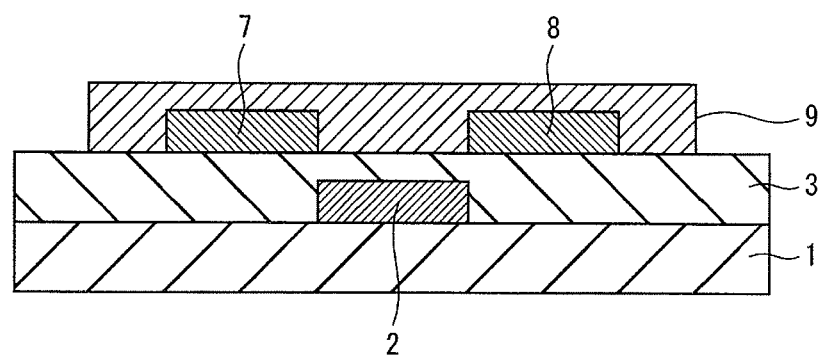
FIG. 6 illustrates a structure of a driving transistor 204 pertaining to embodiment 1 of the present invention.

FIG. 6 illustrates a structure of the driving transistor 204 pertaining to the present embodiment. As is illustrated in FIG. 6, the driving transistor 204 of the present invention includes: a substrate 1; a gate electrode 2; and a gate insulating layer 3. The gate electrode 2 is disposed on the substrate 2, and further, the gate insulating layer 3 is disposed on the substrate 1 having the gate electrode 2 disposed thereon. On the gate insulating layer 3, a source electrode 7 and a drain electrode 8 are disposed with a predetermined distance therebetween, and further, a semiconductor layer 9 is disposed on the gate insulating layer 3 so as to cover the source electrode 7 and the drain electrode 8. The gate electrode 2 is electrically insulated from the source electrode 7 and the drain electrode 8 by the gate insulating layer 3. In the driving transistor 204 having such a structure, an electric current flowing between the source electrode 7 and the drain electrode 8 is controlled by adjusting a voltage value of the voltage applied to the gate electrode 2.

<Structure of Components of Driving Transistor 204>

The substrate 1 is formed by using insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina. Alternatively, the substrate 1 may be an organic resin film.

The gate electrode 2 is formed by using commonly-known electrode material. Examples of such commonly-known electrode material include: an alloy of silver, palladium, and copper; an alloy of silver, rubidium, and gold; an alloy of molybdenum and chromium (MoCr); an alloy of nickel and chromium (NiCr); aluminum (Al); aluminum alloy; indium tin oxide (ITO); and indium zinc oxide (IZO).

The gate insulating layer 3 is formed by using commonly-known gate insulating material (e.g. a silicon oxide). Note that both organic material and inorganic material may be used as the commonly-known gate insulating material.

The source electrode 7 and the drain electrode 8 are formed by using one of tungsten (W), molybdenum (Mo), and molybdenum-tungsten (MoW).

The semiconductor layer 9 is formed by using organic semiconductor material. More specifically, application-type low molecular materials (acene derivatives and porphyrin, phthalocyanine derivatives), oligomers, high molecular materials (thiophenes, fluorenes, and etc.) or the like may be used as the organic semiconductor material. In addition, the semiconductor layer 9 may be formed by using inorganic semiconductor material, and oxide semiconductors and or like may be used as the inorganic semiconductor material, for example. Also, inorganic semiconductors such as application-type oxides may be used as the semiconductor material, in addition to commonly-known organic semiconductors such as acenes, thiophenes, fluorenes, and phthalocyanines.

<Manufacturing Method of Driving Transistor 204>

Subsequently, description is provided on a manufacturing process of the driving transistor 204 of the present embodiment for the sake of example. FIGS. 7A through 7E, FIGS. 8A through 8D, and FIGS. 9A and 9B illustrate an example of the manufacturing process of the driving transistor 204.

Figure 7A:
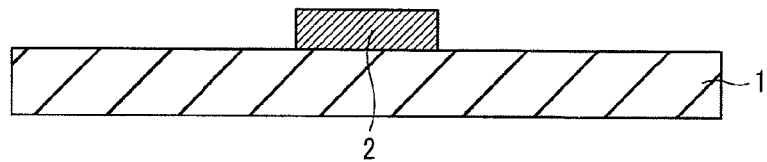
FIGS. 7A through 7E illustrate an example of manufacturing procedures of the driving transistor 204.

Firstly, the substrate 1 is prepared, and the gate electrode 2 is formed on the substrate 1 so prepared (FIG. 7A). More specifically, the gate electrode 2 is formed by forming a thin film of one of the above-mentioned electrode materials by using a commonly-known thin-film forming method such as the vapor deposition method and the sputtering method, and further, by patterning the thin film so formed by using a commonly-known method such as the photolithography method and the lift-off method.

Figure 7B:
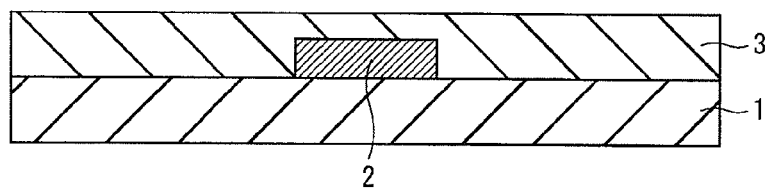
Figure 7C:
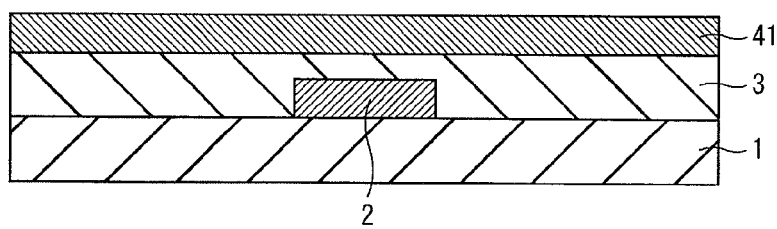
Figure 7D:
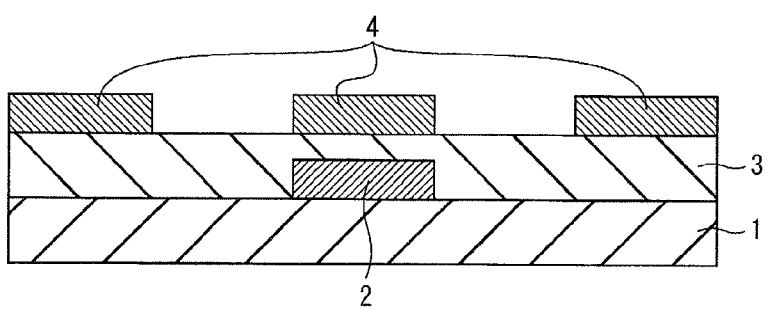

Subsequently, the gate insulating layer 3, which is a silicon oxide film, is formed on the substrate 1 so as to cover the gate electrode 2 as illustrated in FIG. 7B, and further, photo resist material is uniformly applied on the gate insulting layer 3 to form a resist layer 4 as illustrated in FIG. 7C. In this example, a silicon oxide film is used for forming the gate insulting layer 3. However, the present invention is not limited to this, and the gate insulating layer 3 may be formed by using, for instance, an organic polymer material. Following this, a mask having apertures of a predetermined shape is placed on the resist layer 4, and the resist layer 4 is exposed to light from over the mask. Then, redundant photo resist material is removed by using a developer (e.g. a TMAH (Tetra methyl ammonium hydroxide) water solution) (such processing commonly referred to as a "wet process"). Thus, the patterning of the resist layer 4 is completed (FIG. 7D).

Figure 7E:
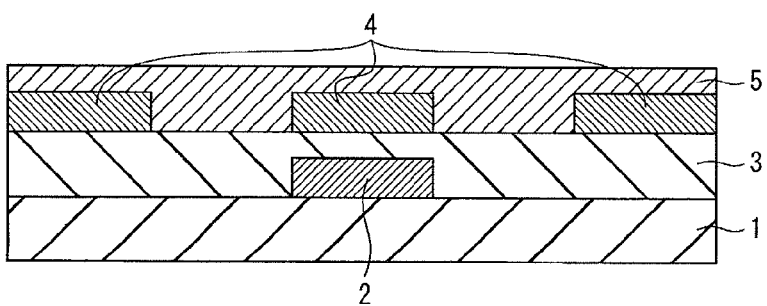
Figure 8A:
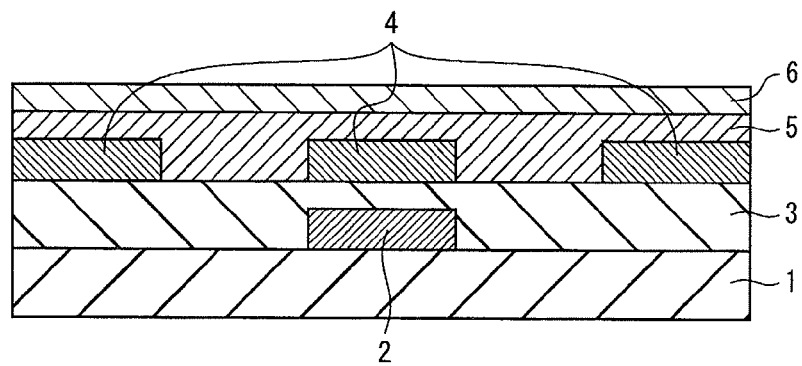
FIGS. 8A through 8D illustrate an example of manufacturing procedures of the driving transistor 204 that are conducted subsequent to the procedures illustrated in FIGS. 7A through 7E.
Figure 8B:
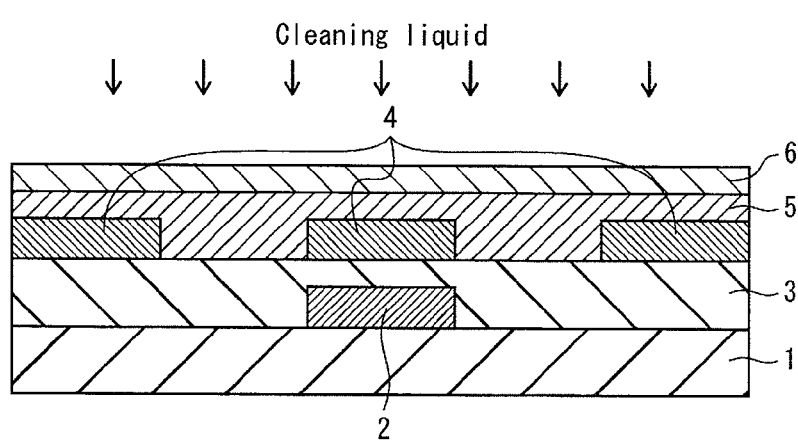
Figure 8C:
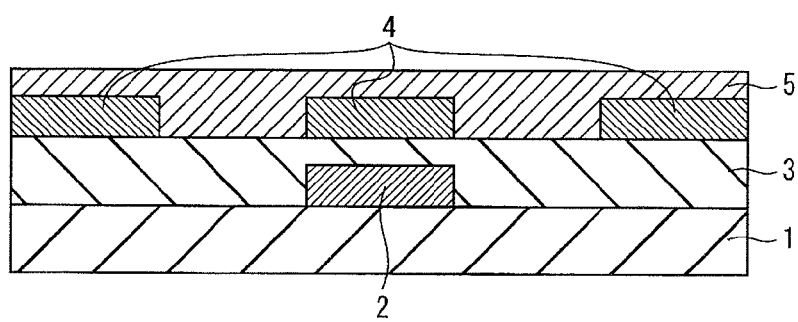

Subsequently, as illustrated in FIG. 7E, a metal layer 5, which is a thin film that is composed of one of W, Mo, and MoW and that is formed by sputtering, for example, is formed so as to cover the resist layer 4 and to fill the apertures formed in the resist layer 4 as a result of the patterning performed in the previous step. However, here, a problem arises that natural oxidation of a surface portion of the metal layer 5 so formed takes place, as illustrated in FIG. 8A. The oxidized surface portion of the metal layer 5 forms a metal oxide layer 6.

Since the existence of the metal oxide layer 6 at the surface portion of the metal layer 5 is problematic, removal thereof is performed by performing cleaning by using a liquid for cleaning (FIG. 8B) (this cleaning where a cleaning liquid is used is to be referred to hereinafter as "pre-cleaning") prior to the forming of the source electrode 7 and the drain electrode 8 by removal of the resist layer 4. As the cleaning liquid used for removing the metal oxide layer 6, alkaline solutions may be used. Among various alkaline solutions, organic alkaline water solutions are especially preferable, and a TMAH (Tetra methyl ammonium hydroxide) water solution, which is an organic alkaline water solution, is used as the cleaning liquid in the present embodiment. However, the present invention is not limited to this, and other materials may be used for preparing the cleaning liquid, including: tetraethylammonium hydroxide; trimethyl (2-hydroxyethyl) ammonium hydroxide (choline); methyl tri (hydroxyethyl) ammonium hydroxide; Dimethylbis (2-hydroxyethyl) ammonium Hydroxide, and etc.

Figure 8D:
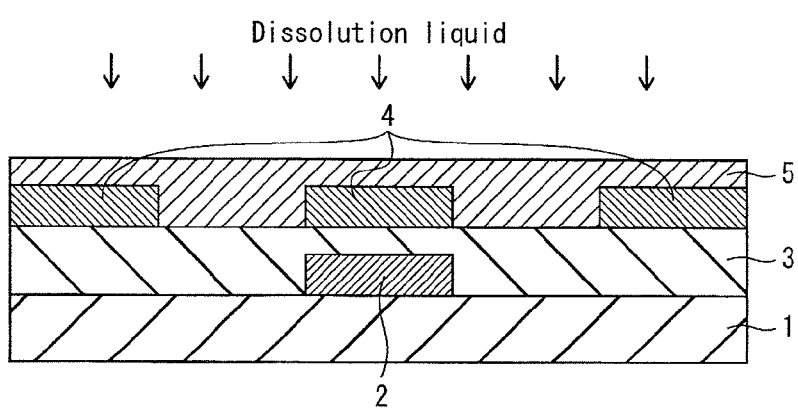
Figure 9A:
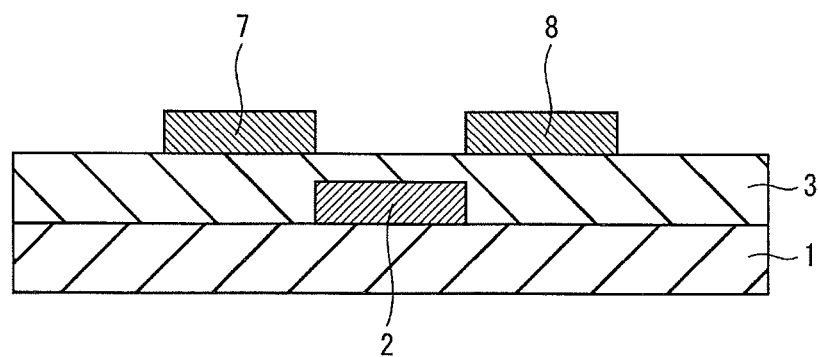
FIGS. 9A and 9B illustrate an example of manufacturing procedures of the driving transistor 204 that are conducted subsequent to the procedures illustrated in FIGS. 8A through 8D.
Figure 9B:
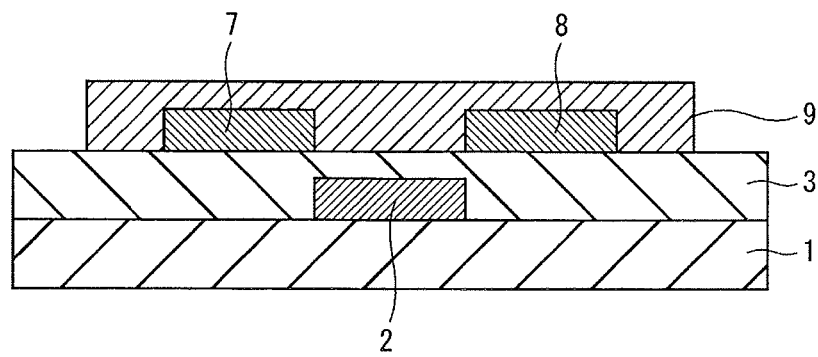

Following the removal of the metal oxide layer 6, the resist layer 4 is removed by using a liquid for dissolution that is different from the cleaning liquid (the removal of the resist layer 4 by using a dissolution liquid is referred to hereinafter as the "resist removal process"), thereby forming the source electrode 7 and the drain electrode 8 (FIGS. 8D and 9A). Subsequently, the semiconductor layer 9 is formed on the gate insulating layer 3 so as to cover the source electrode 7 and the drain electrode 8 as is illustrated in FIG. 9B. As the dissolution liquid used for removing the resist layer 4, an organic stripper solution may be used. For example, in the present embodiment, a DMF (N, N-dimethylformamide) solution is used as the dissolution liquid. However, the present invention is not limited to this, and the dissolution liquid may be prepared by using other materials, such as DMSO (dimethyl sulfoxide) and acetone.

By following the above-provided procedures, the manufacturing of the driving transistor 204 of the present embodiment is completed.

Figure 10:
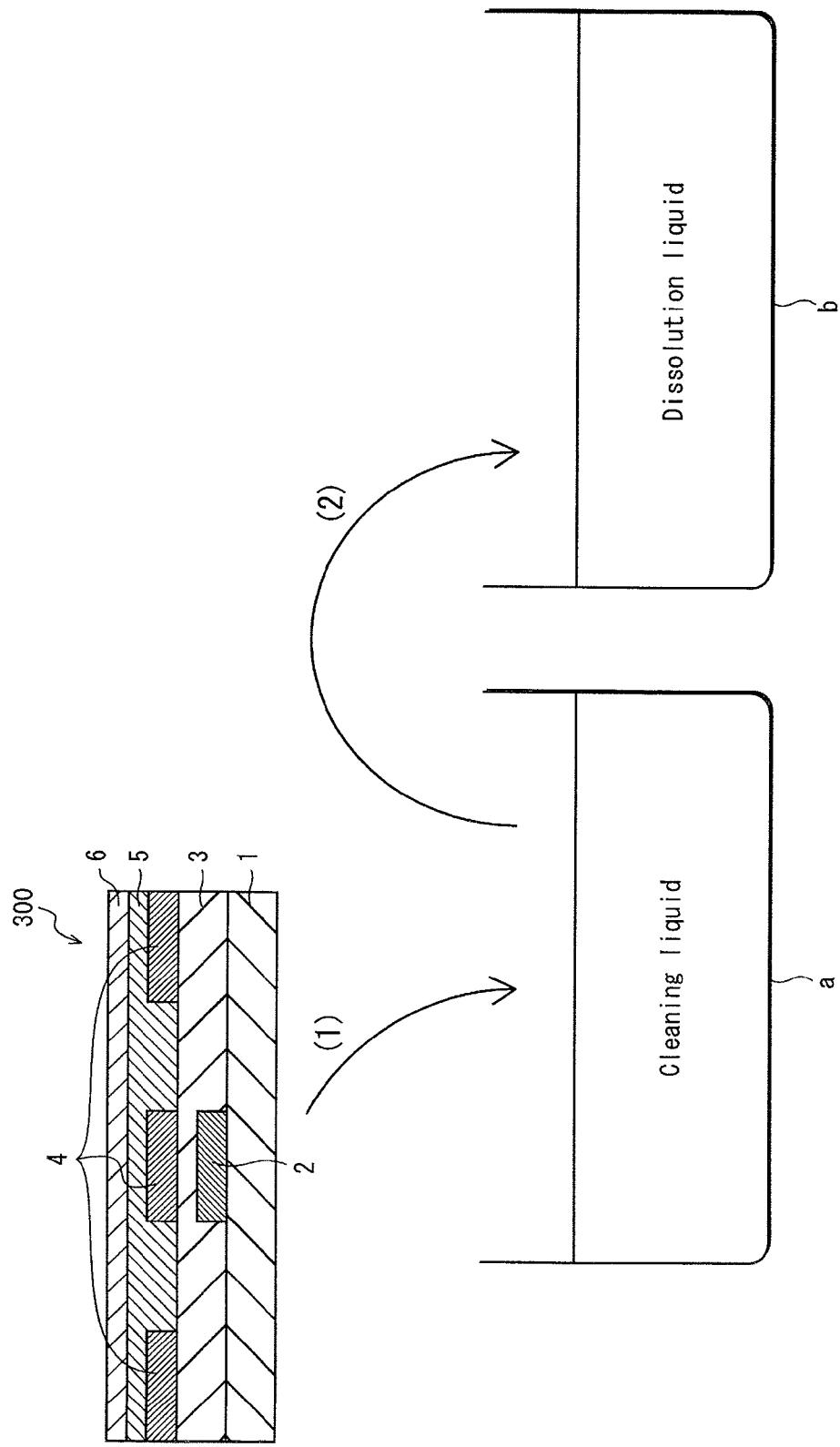
FIG. 10 is a schematic diagram illustrating certain procedures in the manufacturing procedures of the driving transistor 204.

Here, a brief explanation is provided on an example of how the pre-cleaning and the resist removal process are implemented. FIG. 10 is a schematic diagram illustrating certain procedures in the manufacturing of the driving transistor 204. The pre-cleaning is performed by immersing an element 300 in the cleaning liquid filling a container a (FIG. 10 (1)). Note that the element 300 denotes a pre-product of the driving transistor 204, where manufacturing has been completed up to a point corresponding to the illustration in FIG. 8A. Subsequently, the resist removal process is performed by immersing the element 300 in the dissolution liquid filling a different container b (FIG. 10 (2)). Here, it should be noted that the immersing of the element 300 in the dissolution liquid is performed immediately following the immersing of the element 300 in the cleaning liquid. This is since, when the pre-cleaning has been performed and the element 300 is removed from the container a, the cleaning liquid remains on the surface of the metal layer 5 of the element 300 such that the surface of the metal layer 5 is covered with the cleaning liquid. Hence, by immersing the element 300 in the container b immediately after the pre-cleaning without conducting a separate process such as the rinsing of the element 300 with water, the cleaning liquid remaining on the surface of the metal layer 5 of the element 300 prevents natural oxidation of the surface of the metal layer 5 from occurring following the pre-cleaning.

As description has been provided in the above, the manufacturing method pertaining to the present embodiment incorporates a step of pre-cleaning the driving transistor 204 and removing the metal oxide layer 6 by using a cleaning liquid preceding the step of forming the source electrode 7 and the drain electrode 8 by removing the resist layer 4 by using a dissolution liquid that is different from the cleaning liquid. As already mentioned in the above, the metal oxide layer 6 is formed by natural oxidation of the surface of the metal layer 5.

According to this, since the metal oxide layer 6 is removed prior to the step of forming the source electrode 7 and the drain electrode 8 by removing the resist layer with use of the liquid for dissolution, the amount of metal oxide particles dissolving into the liquid for dissolution in the removal of the resist layer is reduced. As a result, the amount of metal oxide residue is reduced, and further, the amount of resist residue adhering onto the channel region after the resist removal process is reduced.

Hence, since the amount of resist residue adhering onto the channel region is reduced, the amount of threshold voltage shift of the semiconductor transistor is reduced.

<Relation Between the Amount of Resist Residue and Threshold Voltage when W is Used for Forming SD Electrodes>

Figure 11:
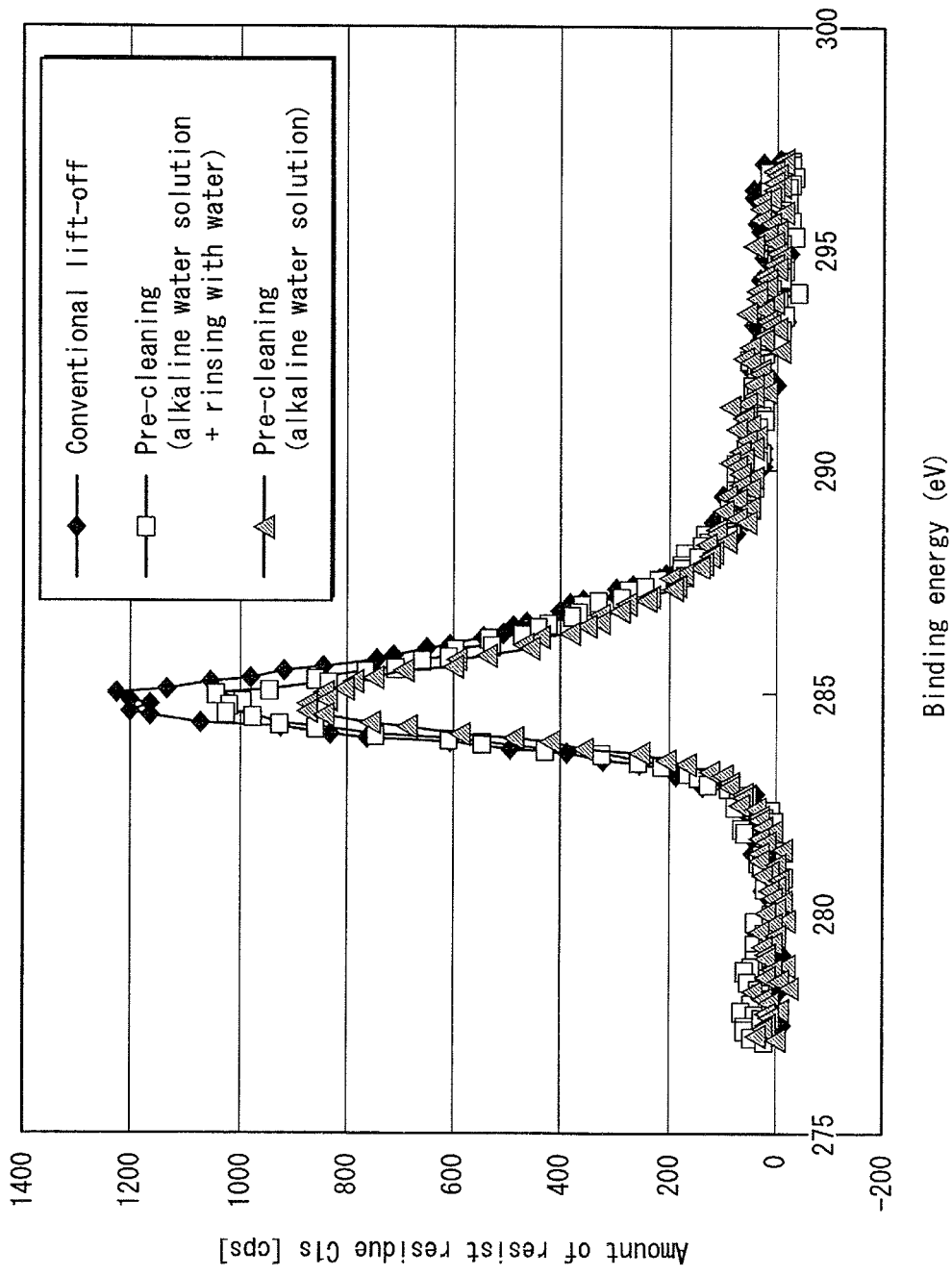
FIG. 11 illustrates changes occurring in the amount of resist residue (C1s) in an area on the gate insulating layer 3 between a source electrode 7 and a drain electrode 8 according to whether or not pre-cleaning is performed.

Description is provided in the following concerning the relation between the amount of resist residue and threshold voltage of the semiconductor transistor, particularly in a case where the source electrode and the drain electrode are formed by using tungsten as the electrode material, with reference to the accompanying FIGS. 11 through 13 and FIGS. 14A through 14C. FIGS. 11 through 13 and FIGS. 14A through 14C correspond to a case where the source electrode 7 and the drain electrode 8 are formed by using tungsten as the electrode material. FIG. 11 illustrates changes in the amount of resist residue in an area between the source electrode 7 and the drain electrode 8 on the gate insulating layer 3. Here, changes in the amount of resist residue are brought about by whether or not the pre-cleaning has been performed. More specifically, comparison is made in FIG. 11 of the amounts of resist residue in three cases of (i) when the pre-cleaning has not been performed, (ii) when the pre-cleaning has been performed by using an alkaline water solution, and (iii) when the pre-cleaning has been performed using the alkaline water solution and further, rinsing with water is performed in order to rinse off the alkaline water solution. In the measurement, the amount of resist residue at an area on the gate insulating layer 3 between the source electrode 7 and the drain electrode 8 was measured by using an X-ray photoemission spectroscopy device. A 1486.6 eV x-ray source was used for the X-ray photoemission spectroscopy measurement, the probe diameter of the X-ray was set to 100 μm, and measurement was performed with respect to an energy level range of 275-295 eV (which corresponds to an energy level range of the C1s). In addition, the horizontal axis in FIG. 11 indicates binding energy, whereas the vertical axis indicates cps amount.

As is illustrated in FIG. 11, when a conventional lift-off process where the pre-cleaning is not performed was conducted, the cps amount of the C1s was approximately 1200 cps. In contrast, when the lift-off process pertaining to the present embodiment where the pre-cleaning is performed (including only the pre-cleaning and not including rinsing with water) was conducted, the cps amount of the C1s was reduced to approximately 900 cps.

Further, when rinsing with water was performed in addition and subsequent to the pre-cleaning in order to rinse off the alkaline water solution used in the pre-cleaning, the cps amount of the C1s indicated a value between 1000 and 1100 cps. Hence, although the effect of the pre-cleaning is reduced compared with the case where only the pre-cleaning is performed and the rinsing with water is not performed, a reduction in the cps amount of the C1s was observed when compared with the case where a conventional lift-off process was performed.

From this, it can be concluded that (i) the cps amount of the C1s is reduced when the pre-cleaning is performed, compared with when the pre-cleaning is not performed, and further, (ii) when performing the pre-cleaning, the cps amount of the C1s is reduced to a greater extent when rinsing with water is not performed and thus, a greater effect is yielded, compared with the case where rinsing with water is additionally performed.

The reason and the mechanism as to why the amount of resist residue is reduced by performing the pre-cleaning has not been completely revealed up to this point, but the following assumptions are made. First of all, according to the correlation illustrated in FIG. 4 between the amount of molybdenum oxide residue and the amount of resist residue, it can be assumed that, during the resist removal process, a physical adhesion and/or a chemical bond is formed between the metal oxide in dissolved state and the resist. Hence, it can be further assumed that, by implementing the pre-cleaning prior to the resist removal process, the amount of metal oxide particles dissolving into the dissolution liquid in the resist removal process is reduced, and thus, the amount of resist forming a physical and/or a chemical bond with the metal oxide in the removal of the resist is reduced. The reduction of resist residue adhering onto the channel region after the resist removal process is considered to be a result of such an effect brought about by the pre-cleaning.

Figure 12:
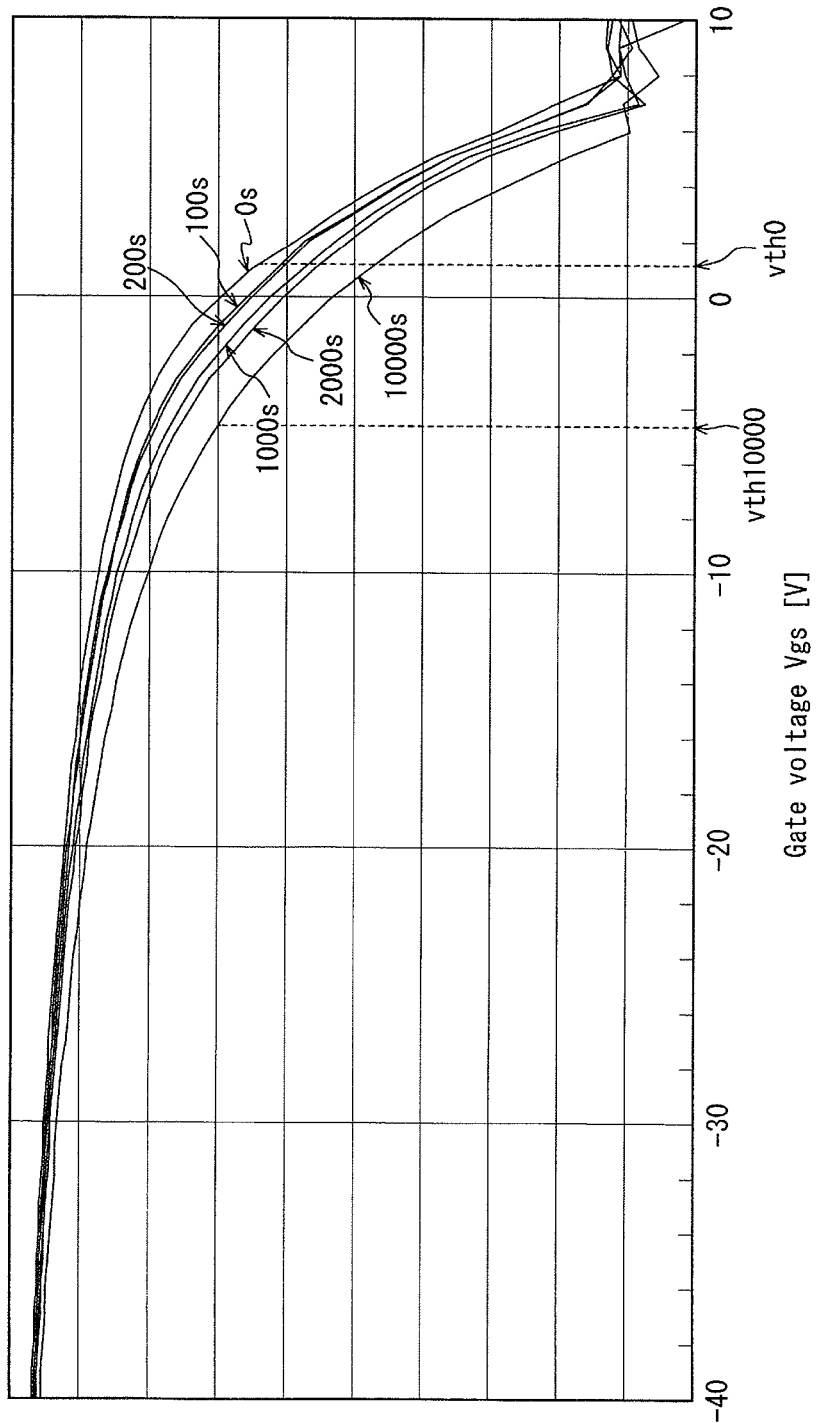
FIG. 12 illustrates drain current (Id)-gate voltage (Vgs) characteristics when the pre-cleaning is not performed.

The following FIG. 12 illustrates drain current (Id)-gate voltage (Vgs) characteristics when the pre-cleaning was not performed. Further, FIG. 13 illustrates drain current (Id)-gate voltage (Vgs) characteristics when the pre-cleaning was performed. In each of the FIGS. 12 and 13, the horizontal axis indicates gate voltage (Vgs) and the vertical axis indicates drain current (Id). Further, the drain current (Id)-gate voltage (Vgs) characteristics after different stress application periods (0 s, 100 s, 200 s, 1000 s, 2000 s, and 10000 s) are illustrated. In addition, the threshold voltages (Vth0, Vth10000) after stress application periods of 0 s and 10000 s are illustrated as examples.

When comparing FIGS. 12 and 13, it is observed that the amount of threshold voltage shift occurring as stress application period extends is smaller in FIG. 13 (that is, when pre-cleaning was performed) than in FIG. 12. For instance, when the stress application period is between 0 s and 10000 s, the amount of threshold voltage shift in FIG. 12 is 5.76 V (refer to FIG. 14A) while the amount of threshold voltage shift in FIG. 13 is 0.85 V (refer to FIG. 14B). Thus, the amount of threshold voltage shift occurring in FIG. 13 is clearly smaller.

Figures 14A, 14B, 14C:
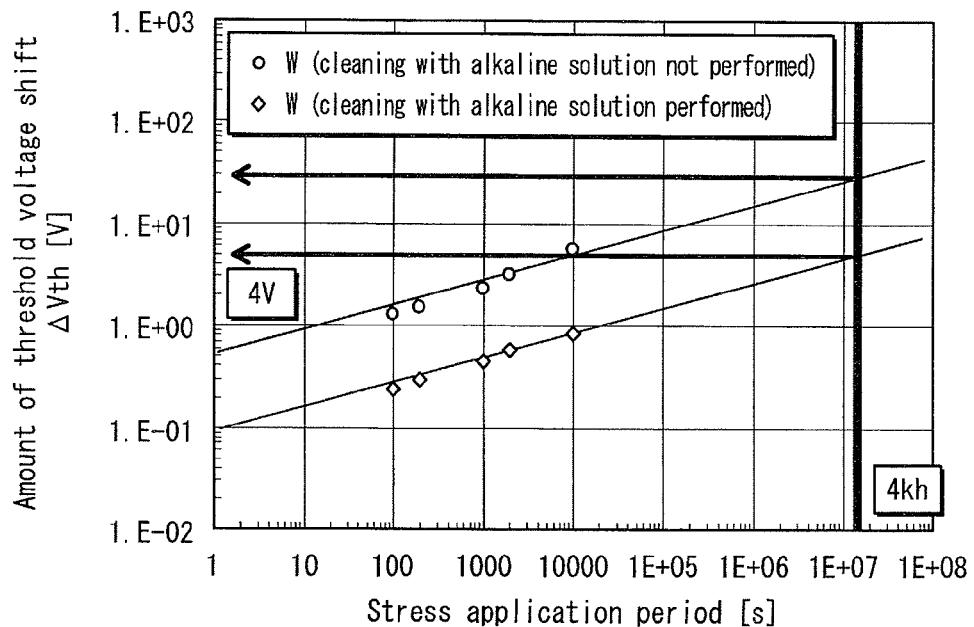
FIG. 14A illustrates relations between stress application period (t), threshold voltage (Vth), and the amount of threshold voltage shift ($\Delta$Vth) when the pre-cleaning is not performed.
FIG. 14B illustrates relations between stress application period (t), threshold voltage (Vth), and the amount of threshold voltage shift ($\Delta$Vth) when the pre-cleaning is performed.
FIG. 14C illustrates relations between stress application period (t) and the amount of threshold voltage shift ($\Delta$Vth).

In the following, further detailed description is provided on the amount of threshold voltage shift with reference to the accompanying FIGS. 14A through 14C. FIG. 14A illustrates relations between stress application period, threshold voltage, and the amount of threshold voltage shift when the pre-cleaning was not performed. In contrast, FIG. 14B illustrates relations between stress application period, threshold voltage, and the amount of threshold voltage shift when the pre-cleaning was performed (not including rinsing with water). In each of FIGS. 14A and 14B, a threshold voltage at each of time points (0 s, 100 s, 200 s, 1000 s, 2000 s, and 10000 s) during the application of stress is illustrated along with a corresponding amount of threshold voltage shift having occurred up to the time point from 0 s.

FIG. 14C illustrates the relation between stress application period and the amount of threshold voltage shift in each of two cases of (i) when the pre-cleaning was not performed, and (ii) when the pre-cleaning was performed. In other words, FIG. 14C is a table of logarithms illustrating the stress application periods and the corresponding threshold voltage shift amounts in FIGS. 14A and 14B. In FIG. 14C, the horizontal axis indicates stress application periods and the vertical axis indicates corresponding amounts of threshold voltage shift.

As can be seen in FIG. 14C, the amount of threshold value shift is smaller when the pre-cleaning was performed, compared with when the pre-cleaning was not performed. In specific, the amount of threshold voltage shift after a stress application period of 4 kh was 4 V when the pre-cleaning was performed.

As description has already been made in the above, a conventional a-Si semiconductor transistor exhibits a threshold voltage shift of approximately 45 V after a stress application period of 4 kh. Taking this into account, the present invention provides a semiconductor transistor which has a higher level of stability compared with a conventional a-Si semiconductor transistor by the pre-cleaning step being incorporated in the manufacturing procedures thereof. Further, it should be noted that the excellent stability of the semiconductor transistor pertaining to the present embodiment is maintained even under the conditions where (i) the semiconductor layer 9 is formed by using organic semiconductor material and (ii) the SD electrodes are formed by using W rather than gold.

<Amount of Resist Residue and Threshold Voltage when Mo is Used for Forming SD Electrodes>

Figure 15:
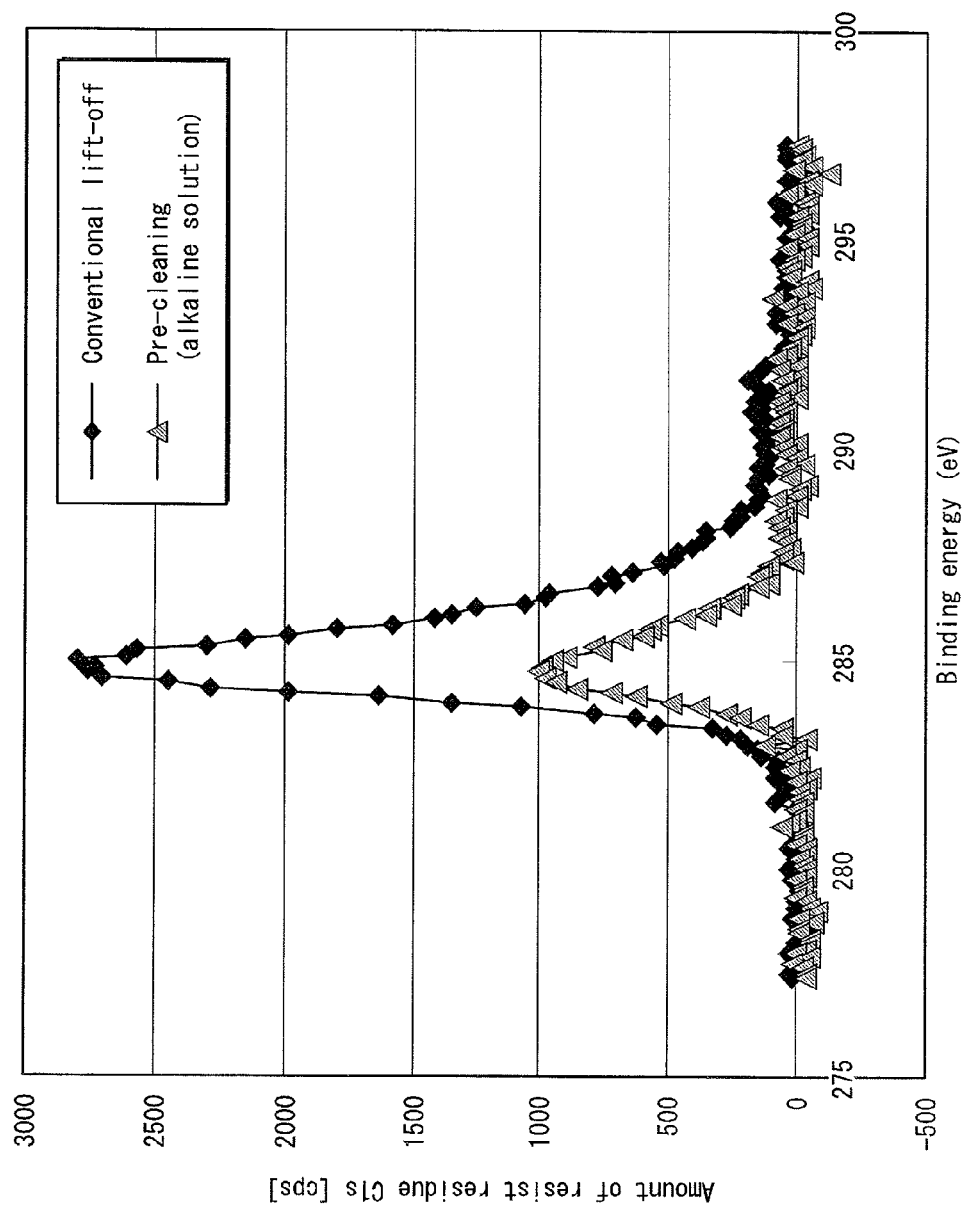
FIG. 15 illustrates changes occurring in the amount of resist residue (C1s) in an area on the gate insulating layer 3 between the source electrode 7 and the drain electrode 8 according to whether or not the pre-cleaning is performed.

Subsequently, description is provided concerning the relation between the amount of resist residue and the threshold voltage, particularly in a case where the source electrode and the drain electrode are formed by using molybdenum as the electrode material, with reference to the accompanying FIGS. 15 through 17 and FIGS. 18A through 18C. FIGS. 15 through 17 and FIGS. 18A through 18C correspond to a case where the source electrode 7 and the drain electrode 8 are formed by using molybdenum as the electrode material. FIG. 15 illustrates changes in the amount of resist residue in an area between the source electrode 7 and the drain electrode 8 on the gate insulating layer 3. Here, changes in the amount of resist residue are brought about by whether or not the pre-cleaning has been performed. The conditions under which the measurement of the amount of resist residue is conducted are as explained with reference to FIG. 11. As is illustrated in FIG. 15, when a conventional lift-off process where the pre-cleaning is not performed was conducted, the cps amount of the C1s was a value between 2500 and 3000 cps. In contrast, when the lift-off process pertaining to the present embodiment where the pre-cleaning is performed (including only the pre-cleaning and not including rinsing with water) was conducted by using an alkaline water solution as the cleaning liquid, the cps amount of the C1s was reduced to approximately 1000 cps.

Figure 16:
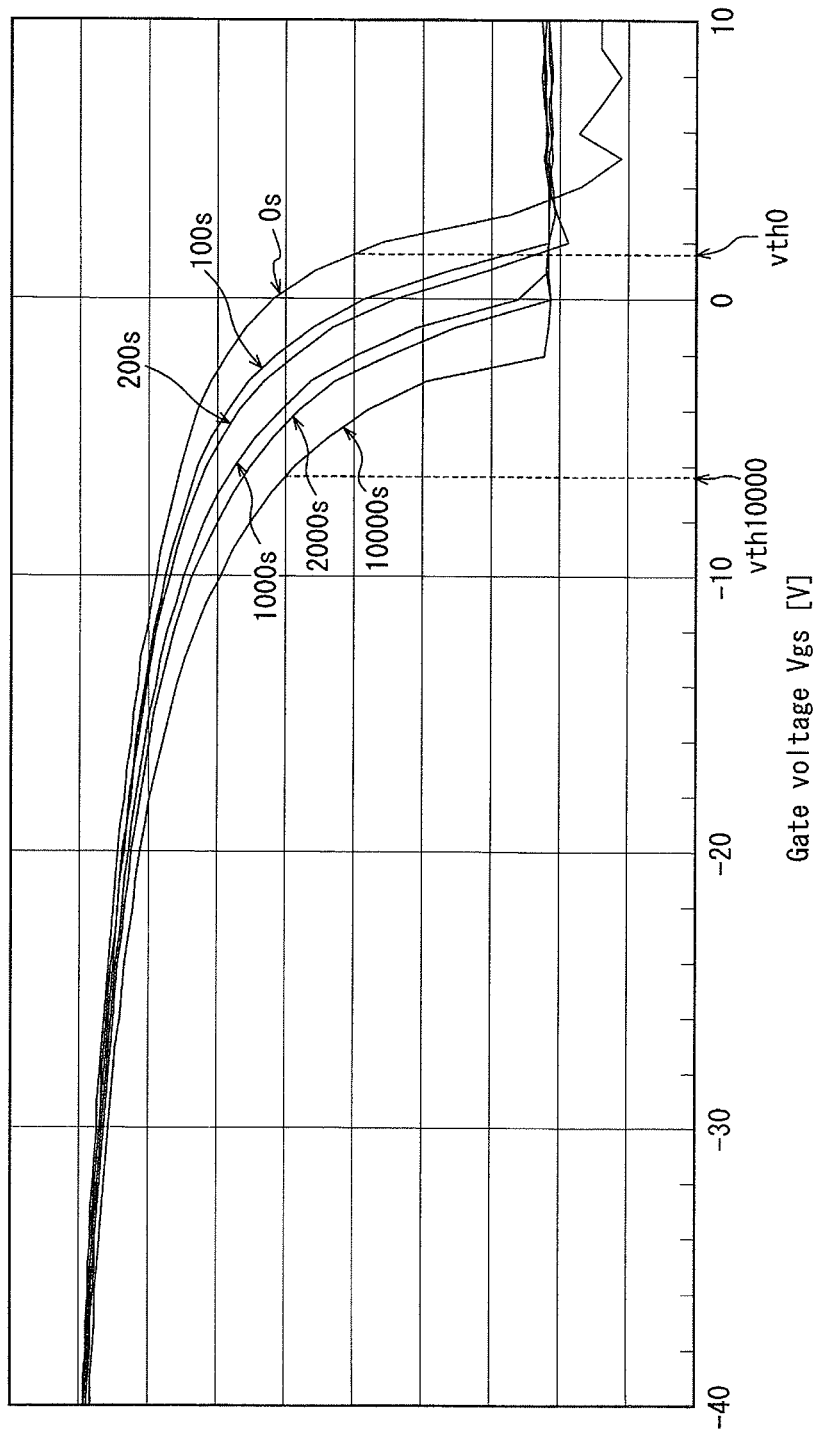
FIG. 16 illustrates drain current (Id)-gate voltage (Vgs) characteristics when the pre-cleaning is not performed.
Figure 17:
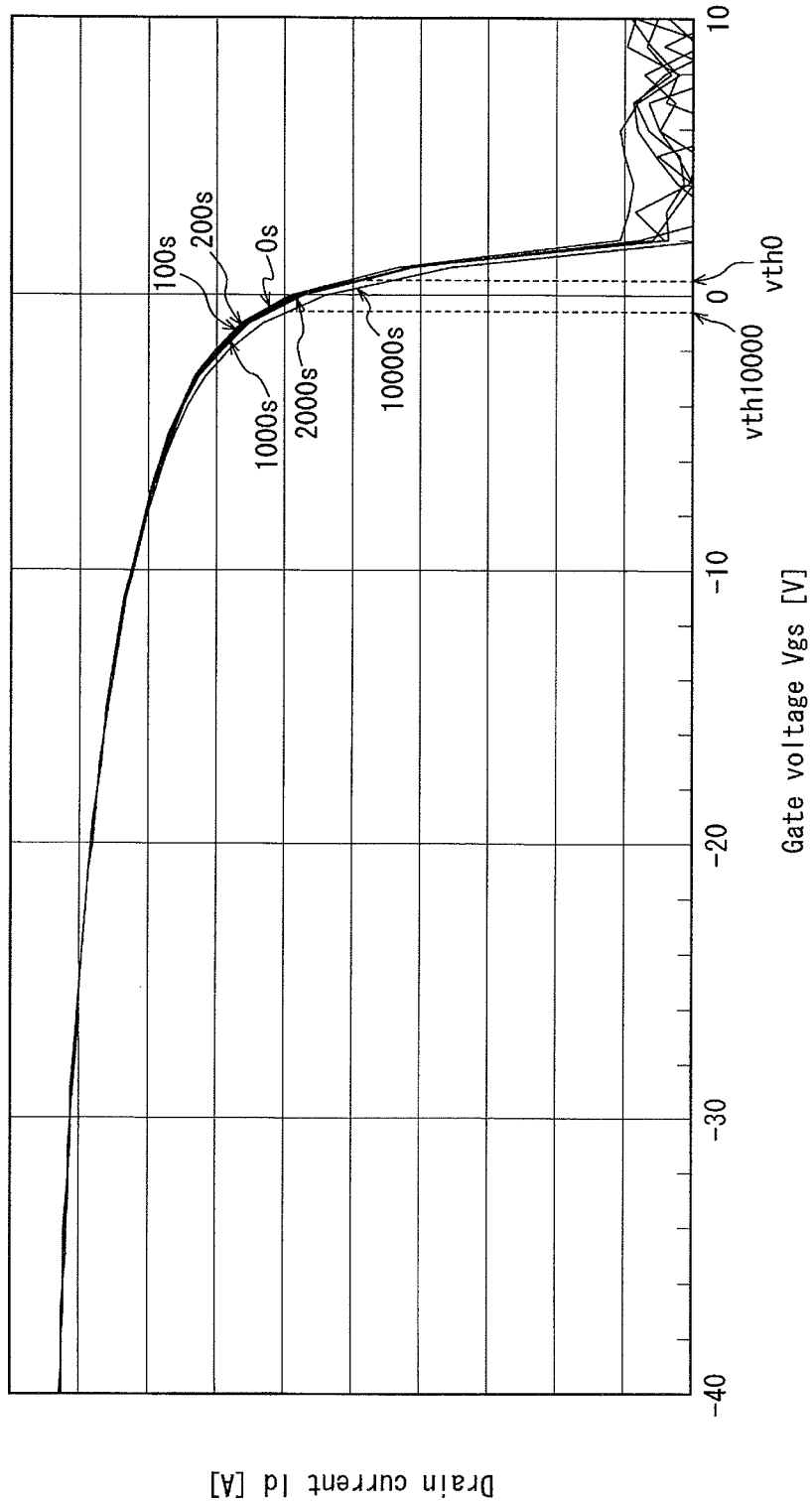
FIG. 17 illustrates drain current (Id)-gate voltage (Vgs) characteristics when the pre-cleaning is performed.

The following FIG. 16 illustrates drain current (Id)-gate voltage (Vgs) characteristics when the pre-cleaning was not performed. In contrast, FIG. 17 illustrates drain current (Id)-gate voltage (Vgs) characteristics when the pre-cleaning was performed (where only the pre-cleaning was performed without rinsing with water). In each of the FIGS. 16 and 17, the horizontal axis indicates gate voltage (Vgs) and the vertical axis indicates drain current (Id). Further, the drain current (Id)-gate voltage (Vgs) characteristics after different stress application periods (0 s, 100 s, 200 s, 1000 s, 2000 s, and 10000 s) are illustrated. In addition, the threshold voltages (Vth0, Vth10000) after the stress application periods of 0 s and 10000 s are illustrated as examples.

When comparing FIGS. 16 and 17, it is observed that the amount of threshold voltage shift occurring as stress application period extends is smaller in FIG. 17 (that is, when pre-cleaning was performed) than in FIG. 16. For instance, when the stress application period is between 0 s and 10000 s, the amount of threshold voltage shift in FIG. 16 is 8.01 V (refer to FIG. 18A) while the amount of threshold voltage shift in FIG. 17 is 0.68 V (refer to FIG. 18B). Thus, the amount of threshold voltage shift in FIG. 17 is clearly smaller.

In the following, more detailed description is provided on the amount of threshold voltage shift with reference to the accompanying FIG. 18. FIG. 18A illustrates relations between stress application period, threshold voltage, and the amount of threshold voltage shift when the pre-cleaning was not performed. In contrast, FIG. 18B illustrates relations between stress application period, threshold voltage, and the amount of threshold voltage shift when the pre-cleaning was performed. In each of FIGS. 18A and 18B, a threshold voltage at each of time points (0 s, 100 s, 200 s, 1000 s, 2000 s, and 10000 s) during the application of stress is illustrated along with a corresponding amount of threshold voltage shift having occurred up to the time point from 0 s.

Figures 18A, 18B, 18C:
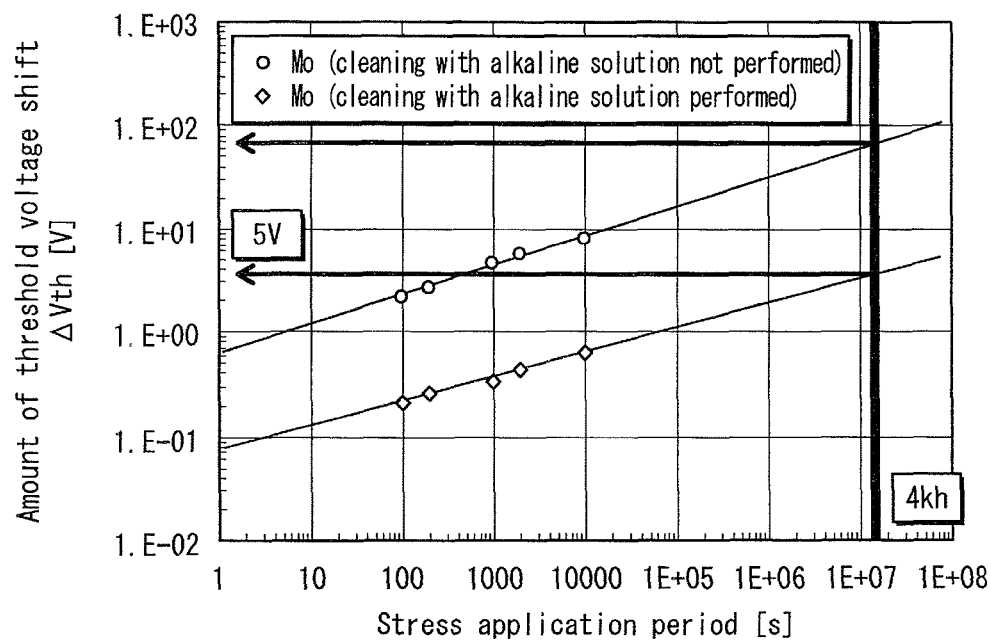
FIG. 18A illustrates relations between stress application period (t), threshold voltage (Vth), and the amount of threshold voltage shift ($\Delta$Vth) when the pre-cleaning is not performed.
FIG. 18B illustrates relations between stress application period (t), threshold voltage (Vth), and the amount of threshold voltage shift ($\Delta$Vth) when the pre-cleaning is performed.
FIG. 18C illustrates relations between stress application period (t) and the amount of threshold voltage shift ($\Delta$Vth).

FIG. 18C illustrates the relation between the stress application period and the amount of threshold voltage shift in each of two cases of (i) when the pre-cleaning was not performed, and (ii) when the pre-cleaning was performed. In other words, FIG. 18C is a diagram providing logarithmic display of the stress application periods and the corresponding amounts of threshold voltage shift in FIGS. 18A and 18B. In FIG. 18C, the horizontal axis indicates stress application periods and the vertical axis indicates corresponding amounts of threshold voltage shift.

As is illustrated in FIG. 18C, the amount of threshold value shift is smaller when the pre-cleaning was performed, compared with when the pre-cleaning was not performed. In specific, the amount of threshold voltage shift after a stress application period of 4 kh was 5 V when the pre-cleaning was performed.

Taking this into account, the present invention provides a semiconductor transistor which has a higher level of stability compared with a conventional a-Si semiconductor transistor by the pre-cleaning step being incorporated in the manufacturing procedures thereof. Further, it should be noted that the high stability of the semiconductor transistor pertaining to the present embodiment is maintained even under the conditions where (i) the semiconductor layer 9 is formed by using organic semiconductor material and (ii) the SD electrodes are formed by using Mo rather than gold.

<Amount of Resist Residue and Threshold Voltage when MoW is Used for Forming SD Electrodes>

Subsequently, description is provided concerning the relation between the amount of resist residue and the threshold voltage, particularly in a case where the source electrode and the drain electrode are formed by using molybdenum-tungsten as the electrode material. Even in a case where the source electrode 7 and the drain electrode 8 are formed by using molybdenum-tungsten as the electrode material, it can be assumed that the cps amount of the C1s is reduced to a greater extent by performing the lift-off process pertaining to the present embodiment where the pre-cleaning is performed by using an alkaline-water solution as the cleaning liquid, rather than a conventional lift-off process where the pre-cleaning is not performed.

Even if a surface portion of the metal layer 5, that is, the MoW layer in this case, undergoes natural oxidation and becomes the metal oxide layer 6, the removal of the metal oxide layer 6 can be realized by performing the pre-cleaning as performed when the metal layer 5 is formed by using each of Mo and W.

Further, as is illustrated in FIGS. 14C and 18C, by reducing the cps amount of the C1s to as low as approximately 1000 cps, the amount of threshold voltage shift can be reduced to a low level of 4 or 5 V. Hence, similar as in the other cases described in the above, even in a case where MoW is used as the electrode material for forming the SD electrodes, the amount of threshold value shift can be reduced by performing the pre-cleaning and reducing the cps amount of the C1s to as low as approximately 1000 cps.

<Structure of EL Display Panel 105>

(Overall Structure of EL Display Panel 105)

Figure 19:
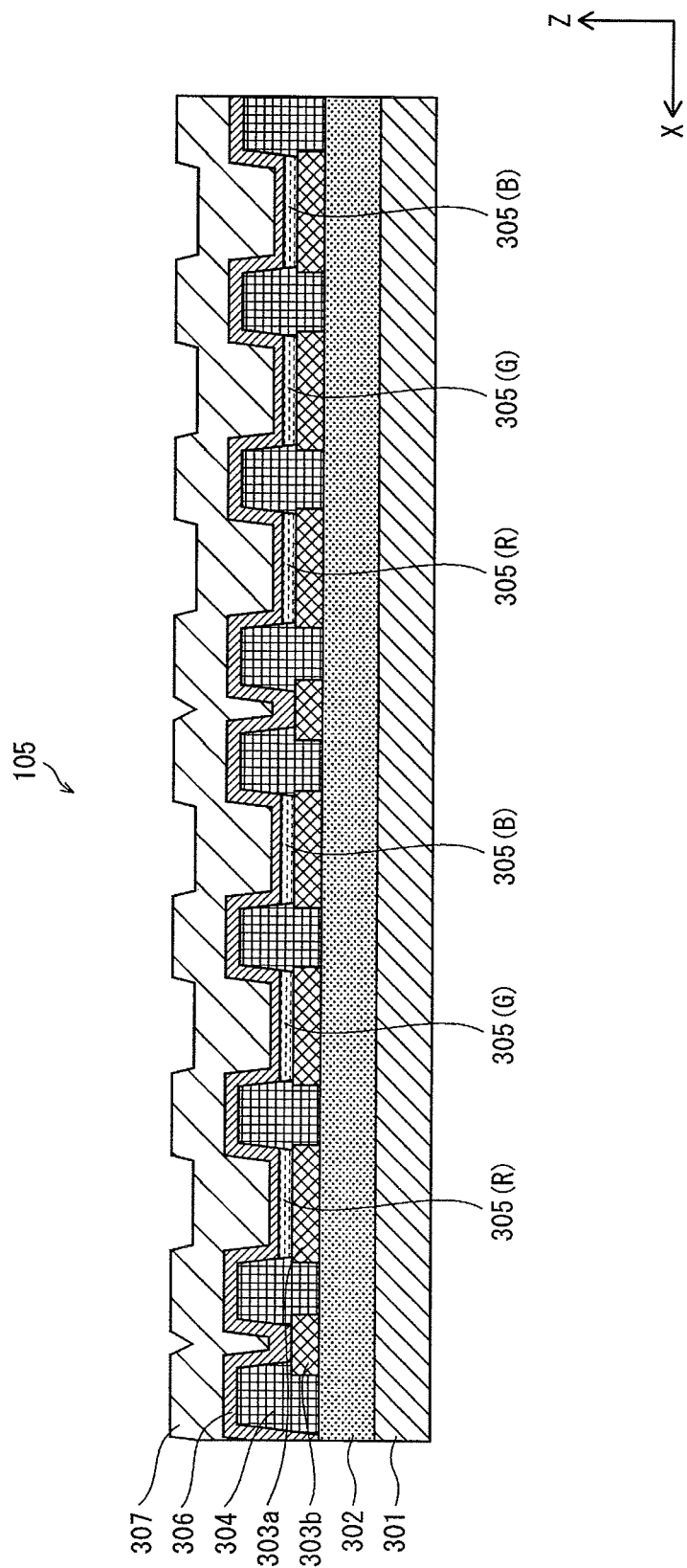
FIG. 19 is a partial schematic cross-sectional view illustrating main parts of the EL display panel 105 of embodiment 1.

In the following, detailed description is provided on the structure of the EL display panel 105. FIG. 19 is a partial schematic cross-sectional view illustrating main parts of the EL display panel 105 of embodiment 1. As is illustrated in FIG. 19, the EL display panel 105 pertaining to embodiment 1 has a structure where an interlayer insulating film 302 is formed on a TFT substrate 301, and anodes 303a are formed on the interlayer insulting film 302 in a matrix state by patterning. Each of the anodes 303a corresponds to a sub-pixel of the EL display panel 105.

Further, three sub-pixels adjacent in the X-axis direction in FIG. 19 constitute a single pixel of the EL display panel 105. Additionally, one auxiliary electrode 303b is provided to each of the pixels so as to form lines on the interlayer insulating film 302.

A bank 304 is formed, such that adjacent anodes 303a and an anode 303a and an auxiliary electrode 303b that are adjacent to each other are partitioned thereby. Within an area on an anode 303a that is defined by the bank 304, an organic light-emitting layer 305 of a predetermined color is laminated. Further, on the organic light-emitting layer 305, a cathode 306 and a sealing layer 307 are formed. More specifically, the cathode 306 and the sealing layer 307 are each formed as layers extending over the areas defined by the bank 304, and so as to be continuous between adjacent organic light-emitting layers 305 and between an organic light-emitting layer 305 and an auxiliary electrode 303b that are adjacent to each other.

In the following, detailed description is provided concerning the material for forming each of the components of the EL display panel 105 and other similar matters.

<Structure of Components>

The TFT substrate 301 includes the substrate 1, a TFT and a wiring member disposed on the substrate 1, and a passivation film disposed so as to cover the TFT.

The interlayer insulating film 302 is provided so as to planarize unevenness found on the surface of the TFT substrate 301, and is formed by using insulating material such as polyimide resins and acrylic resins.

The anodes 303a and the auxiliary electrodes 303b are formed by using Al (aluminum) or an aluminum alloy. Note that, concerning the anodes 303a in specific, silver, an alloy of silver, palladium, and copper, an alloy of silver, rubidium, and gold, MoCr (an alloy of molybdenum and chromium), NiCr (an alloy of nickel and chromium) or the like may be used for the forming thereof. Since the EL display panel 105 pertaining to embodiment 1 is a top emission type EL display panel, it is preferable that the anodes 303a be formed using reflective material.

The bank 304 is formed by using organic material such as resins, and have insulating property with respect to electricity. Examples of such organic material that can be used for forming the bank 304 include: acrylic resins; polyimide resins; and novolac type phenolic resins. Additionally, it is preferable that the bank 304 be formed by using material resistant to organic solvents. Further in addition, since there are cases where the bank 304 undergoes etching and baking, it is preferable that material having a high degree of resistivity against such processing be chosen for forming the bank 304, so as to avoid excessive deformation and degradation.

Further, it is preferable that the organic light-emitting layer 305 be formed using such materials as recited, for example, in Japanese Patent Application Publication No. H5-163488. Such materials include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc.

The cathode 306 is formed by using such material as ITO (indium tin oxide) and IZO (indium zinc oxide), for example. Since the EL display panel 305 is a top emission type EL display panel, it is preferable that the cathode 306 be formed by using light-transmissive material.

The sealing layer 307 inhibits the organic light-emitting layer 305 from being exposed to moisture, air, and etc., and is formed by using such material as SiO (silicon monoxide), SiN (silicon nitride), SiON (silicon oxynitride), SiC (silicon carbide), SiOC (silicon oxycarbide), AlN (aluminum nitride), and Al2O3 (aluminum oxide). Since the EL display panel 305 is a top emission type EL display panel, it is preferable that the sealing layer 307 be formed by using light-transmissive material.

(Supplement)

In the above, description has been provided on the manufacturing method of a semiconductor transistor pertaining to the present invention with reference to an embodiment thereof. However, it is to be noted that various changes and modifications will be apparent to those skilled in the art and therefore, unless otherwise such changes and modifications depart from the scope of the present invention, they should be construed as being included therein.

(1) Description has been made in the above based on a semiconductor transistor having a so-called bottom-gate structure. However, the present invention is not limited to this, and it is assumed that the present invention may be applied to a semiconductor transistors having a so-called top-gate structure. In specific, the bottom-gate structure and the top-gate structure differ in that, in a semiconductor transistor having a bottom-gate structure, a gate insulating layer and a gate electrode are disposed on a substrate in the stated order, whereas in a semiconductor having a top-gate structure, a gate insulating layer and a gate electrode are disposed on a semiconductor layer in the stated order. Although such a difference exists, other structural aspects and manufacturing procedures are considered to be similar.

(2) Although description has been made in the above that an alkaline solution is used as the cleaning liquid, other liquids may be used such as a stripper liquid (amine-type) and a developer (TMAH-type).

Figure 20:
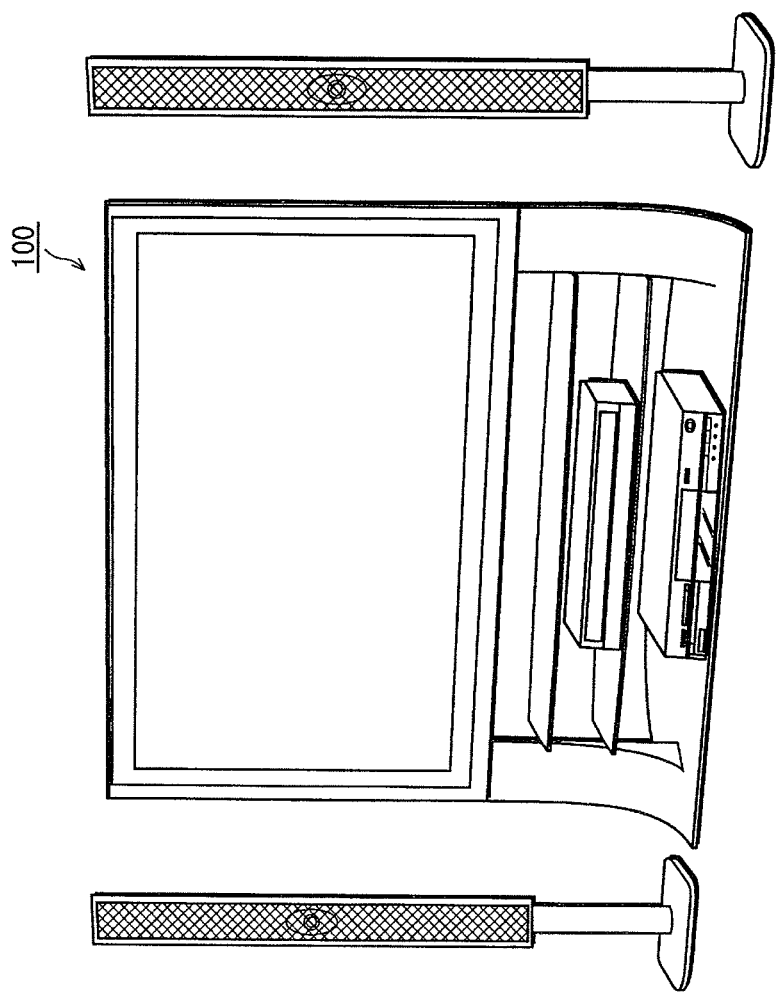
FIG. 20 illustrates an external appearance of the display apparatus 200.

(3) Although no indication has been made in the above of an exterior appearance of the display apparatus 100, the display apparatus 100 has, for instance, an exterior appearance as illustrated in FIG. 20.

(4) Although description has been made in the above that the forming of the semiconductor layer is performed succeeding the forming of the SD electrodes, the present invention is not limited to this. Post-processing (including Steps 1 through 3) as described in the following may be performed succeeding the forming of the SD electrodes. In specific, first of all in the post-processing, a portion of the gate insulting layer between the source electrode and the drain electrode is removed by using a cleaning liquid (for instance, hydrofluoric acid) (Step 1). Note that here, the portion of the gate insulating layer to be removed includes at least a surface thereof. Subsequently, surface treatment is performed with respect to the portion of the gate insulating layer having the surface thereof removed (Step 2). The surface treatment is performed to chemically deactivate the surface of the portion of the gate insulating layer, and is performed by using a surface treatment agent (for instance, HMDS (hexamethyldisilazane)). Finally, the portion of the gate insulating layer having the surface thereof treated is cleaned by using a polar solvent (for instance, IPA (Isopropyl alcohol)) (Step 3). Following the completion of such post-processing, the semiconductor layer is formed on the gate insulating layer by application of semiconductor material.

The post-processing as described above is effective for the following reasons. Firstly, by performing Step 1, the process residue adhering onto the surface of the portion of the gate insulating layer is removed with a higher degree of probability. On the other hand, by removing the surface of the portion of the gate insulating layer in Step 1, substances normally existing internally within the gate insulating layer, for instance a hydroxyl group (OH group), are exposed to the outside to a certain extent. If the semiconductor layer is formed on the gate insulating layer while the gate insulating layer is in such a state, there is a risk that a shift of threshold voltage may occur by the hydroxyl group forming a chemical bond with the semiconductor material used for forming the semiconductor layer.

Step 2 of the post-processing eliminates such a risk arising when the hydroxyl group of the gate insulating layer is exposed. That is, by performing surface treatment of the gate insulating layer, the hydroxyl group is caused to form a chemical bond with the surface treatment agent, and accordingly, the bonding of the hydroxyl group with the semiconductor material is prevented. Hence, the occurrence of threshold value shift is appropriately prevented.

Further, by performing Step 3 of the post-processing, residue of the surface treatment agent and unnecessary chemical compounds deriving from the surface treatment which are remaining at the surface of the gate insulating layer are removed. Thus, the risk is eliminated of newly-produced residue, such as the surface treatment agent or the like, remaining at the surface of the gate insulating layer upon the forming of the semiconductor layer and causing deterioration of the characteristics of the semiconductor transistor.

(5) In the EL display panel 105, a hole injection layer, a hole transport layer, or a hole injection/transport layer may be interposed between the anode 303a and the organic light-emitting layer 305 as necessary. Similarly, an electron injection layer, an electron transport layer, or an electron injection/transport layer may be interposed between the organic light-emitting layers 305 and areas of the cathode 306 above the organic light-emitting layers 305 as necessary.

INDUSTRIAL APPLICABILITY

The manufacturing method pertaining to the present invention is applicable as the manufacturing method for a thin-film transistor used in various applications including: display devices; TV devices; portable electronic device displays; and illumination light sources, the uses of which include household, public, and professional use

REFERENCE SIGNS LIST 1 substrate
2 gate electrode
3 gate insulating layer
4 resist layer
5 metal layer
6 metal oxide layer
7 source electrode
8 drain electrode
9 semiconductor layer
100 display apparatus
101 controlling circuit
102 memory
103 scanning line driving circuit
104 data line driving circuit
105 EL display panel
200 scanning line
201 data line
202 power supply line
203 switching transistor
204 driving transistor
205 EL element
206 retention capacitor
207 common electrode
208 pixel circuit
209 driving circuit
301 TFT substrate
302 interlayer insulating film
303a anodes
303b auxiliary electrode
304 bank
305 organic light-emitting layer
306 cathode
307 sealing layer

The invention claimed is:

1. A manufacturing method for a semiconductor transistor that includes a gate electrode, a gate insulating layer, a source electrode, a drain electrode, and a semiconductor layer, the manufacturing method comprising:
   forming a resist layer containing resist material on a base layer that includes a substrate;
   patterning areas of the resist layer and thereby forming a plurality of apertures;
   forming a metal layer containing metallic material so as to cover the resist layer and to fill the apertures formed in the resist layer, the metallic material being for forming a source electrode and a drain electrode;
   removing a metal oxide layer by performing cleaning with use of a liquid for cleaning, the metal oxide layer being formed by oxidation of a top surface of the metal layer;
   forming, after the removing of the metal oxide layer, the source electrode and the drain electrode by removing the resist layer by use of a liquid for dissolution different from the liquid for cleaning, the source electrode and the drain electrode constituted of the metallic material having been disposed in the apertures; and
   forming a semiconductor layer so as to cover the source electrode and the drain electrode.

2. The manufacturing method of claim 1, wherein the removing of the metal oxide layer by using the liquid for cleaning is performed without removing the resist layer.

3. The manufacturing method of claim 1, wherein an alkaline solution is used as the liquid for cleaning, and an organic stripper solution is used as the liquid for dissolution.

4. The manufacturing method of claim 1, wherein the metallic material for forming the metal layer is one of tungsten, molybdenum, and a molybdenum-tungsten alloy.

5. The manufacturing method of claim 1, wherein the base layer further includes, in addition to the substrate: a gate electrode formed on the substrate; and a gate insulating layer formed so as to cover the gate electrode.

6. The manufacturing method of claim 1, wherein remaining metallic material of the metal layer is covered with the liquid for cleaning when the source electrode and the drain electrode are formed by the removing of the resist layer by the use of the liquid for dissolution to prevent oxidation of the remaining metallic material.

7. The manufacturing method of claim 1, wherein the source electrode and the drain electrode are formed by the removing of the resist layer by the use of the liquid for dissolution without remaining metallic material of the metal layer being rinsed after the removing of the metal oxide layer.

8. The manufacturing method of claim 1, wherein the removing of the metal oxide layer by the performing of the cleaning with the use of the liquid for cleaning includes:
   immersing at least the metal oxide layer in the liquid for cleaning.

9. The manufacturing method of claim 8, wherein the forming of the source electrode and the drain electrode by the removing of the resist layer by the use of the liquid for dissolution includes:
   immersing at least the resist layer and remaining metallic material of the metal layer in the liquid for dissolution.

10. The manufacturing method of claim 9, wherein the liquid for cleaning in which at least the metal oxide layer is immersed is in a first container, and the liquid for dissolution in which at least the resist layer and the remaining metallic material are immersed is in a second container different than the first container.

11. A manufacturing method for a semiconductor transistor, the manufacturing method comprising:
   forming apertures in a resist layer in correspondence with a mask;
   covering the resist layer and filling the apertures in the resist layer with a metal layer, a surface portion of the metal layer being oxidized and forming a metal oxide layer at the surface portion of the metal layer;
   pre-cleaning the surface portion of the metal layer with a cleaning liquid to remove the metal oxide layer;

removing the resist layer with a dissolution liquid different than the cleaning liquid after the pre-cleaning to define electrodes, the electrodes comprising portions of the metal layer filled in the apertures in the resist layer.

12. The manufacturing method of claim 11, wherein the resist layer and remaining portions of the metal layer are covered with the cleaning liquid when the resist layer is being removed with the dissolution liquid after the pre-cleaning to prevent oxidation of the remaining portions of the metal layer.

13. The manufacturing method of claim 11, wherein the resist layer is removed with the dissolution liquid after the pre-cleaning without being rinsed.

14. The manufacturing method of claim 11, wherein the pre-cleaning of the surface portion of the metal layer includes:
   immersing at least the metal oxide layer at the surface portion of the metal layer in the cleaning liquid.

15. The manufacturing method of claim 14, wherein the removing of the resist layer includes:
   immersing the resist layer and remaining portions of the metal layer in the dissolution liquid after the immersing of at least the metal oxide layer in the cleaning liquid.

16. The manufacturing method of claim 15, wherein
   the cleaning liquid in which at least the metal oxide layer is immersed during the pre-cleaning is in a first container, and
   the dissolution liquid in which the resist layer and the remaining portions of the metal layer are immersed during the removing is in a second container different than the first container.

* * * * *